(12) United States Patent
Sawa et al.

(10) Patent No.: US 8,157,157 B2
(45) Date of Patent: Apr. 17, 2012

(54) SOLDER BALL LOADING MASK, APPARATUS AND ASSOCIATED METHODOLOGY

(75) Inventors: Shigeki Sawa, Ibi-gun (JP); Katsuhiko Tanno, Ibi-gun (JP); Osamu Kimura, Ibi-gun (JP); Koji Kuribayashi, Ibi-gun (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 0 days.

(21) Appl. No.: 12/349,748

(22) Filed: Jan. 7, 2009

(65) Prior Publication Data

US 2009/0294516 A1    Dec. 3, 2009

Related U.S. Application Data

(60) Provisional application No. 61/057,479, filed on May 30, 2008.

(51) Int. Cl.
 *B23K 1/00* (2006.01)
 *B23K 1/20* (2006.01)

(52) U.S. Cl. ............... 228/123.1; 228/175; 228/121; 228/122.1; 228/124.1; 228/124.5

(58) Field of Classification Search ......... 228/246, 228/253, 175, 121, 122.1, 123.1, 124.1, 124.5
See application file for complete search history.

(56) References Cited

U.S. PATENT DOCUMENTS

| 2001/0008160 | A1* | 7/2001 | Suzuki et al. ............... 156/64 |
| 2006/0086777 | A1* | 4/2006 | Itoh et al. .................. 228/253 |
| 2007/0096327 | A1* | 5/2007 | Kawamura et al. ........ 257/774 |
| 2007/0251089 | A1 | 11/2007 | Kawamura et al. |
| 2008/0102620 | A1 | 5/2008 | Sakaguchi |

FOREIGN PATENT DOCUMENTS

| JP | 2006-324618 | 11/2006 |
| WO | WO2006-043377 A | 4/2006 |
| WO | WO 2007/004657 A1 | 1/2007 |

OTHER PUBLICATIONS

Takagi Kiyoshi, "Build-Up Multilayer Printed Wiring Board", Jul. 20, 2000 by Nikkan Kogyo Shimbun, Ltd., pp. 157-271.

* cited by examiner

*Primary Examiner* — Kiley Stoner
*Assistant Examiner* — Erin Saad
(74) *Attorney, Agent, or Firm* — Oblon, Spivak, McCelland, Maier & Neustadt, L.L.P.

(57) ABSTRACT

A solder ball loading method capable of securely loading solder balls on connection pads includes applying flux on each connection pad group of a printed wiring board flux is not applied to a contact portion between a spacer and the printed wiring board to keep the flux from attaching to the spacer. Because the flux is not attached to the spacer, when the mask is detached from the printed wiring board, the printed wiring board need not be inverted, and damage to the solder resist layer 70 is minimized. Further, the heights of the solder balls and the upper surface of the mask are made equal by using the spacer, making it possible to securely load the solder balls on the electrode pads, one solder ball for each connection pad, and to reduce a probability that solder balls are not loaded or that a plurality of the solder balls are loaded onto a single connection pad.

6 Claims, 19 Drawing Sheets

FIG. 2
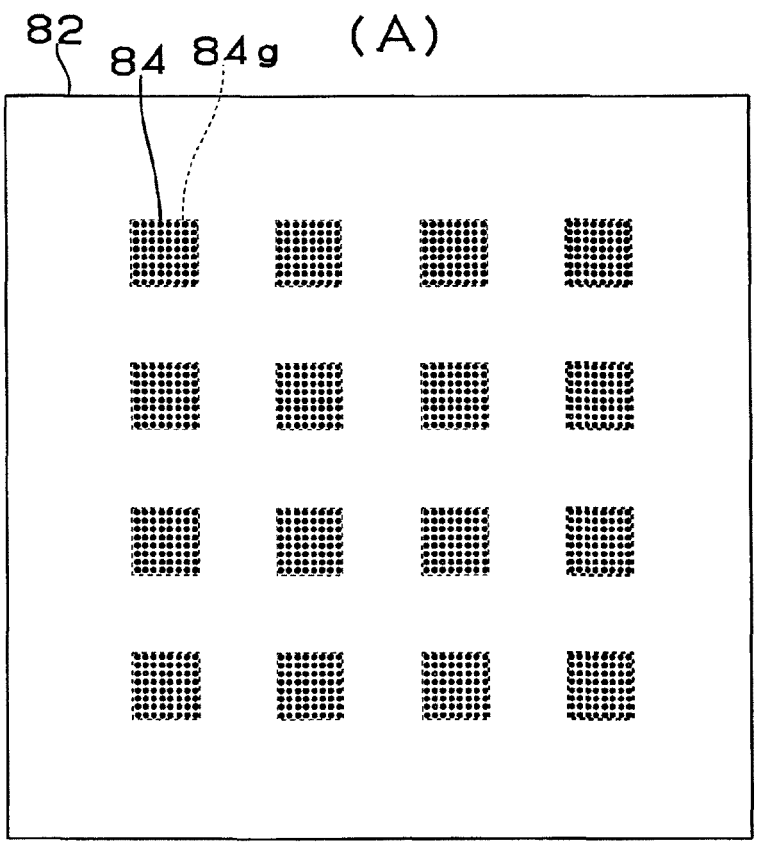
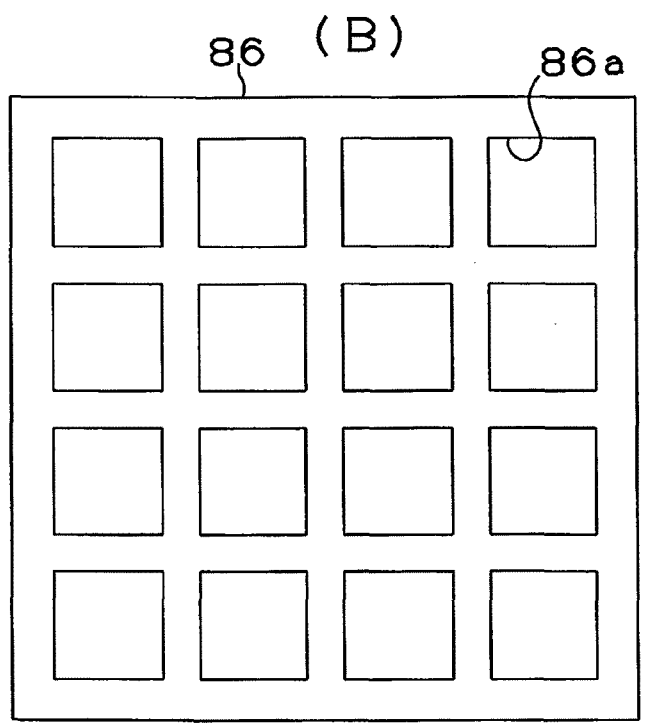

FIG. 7
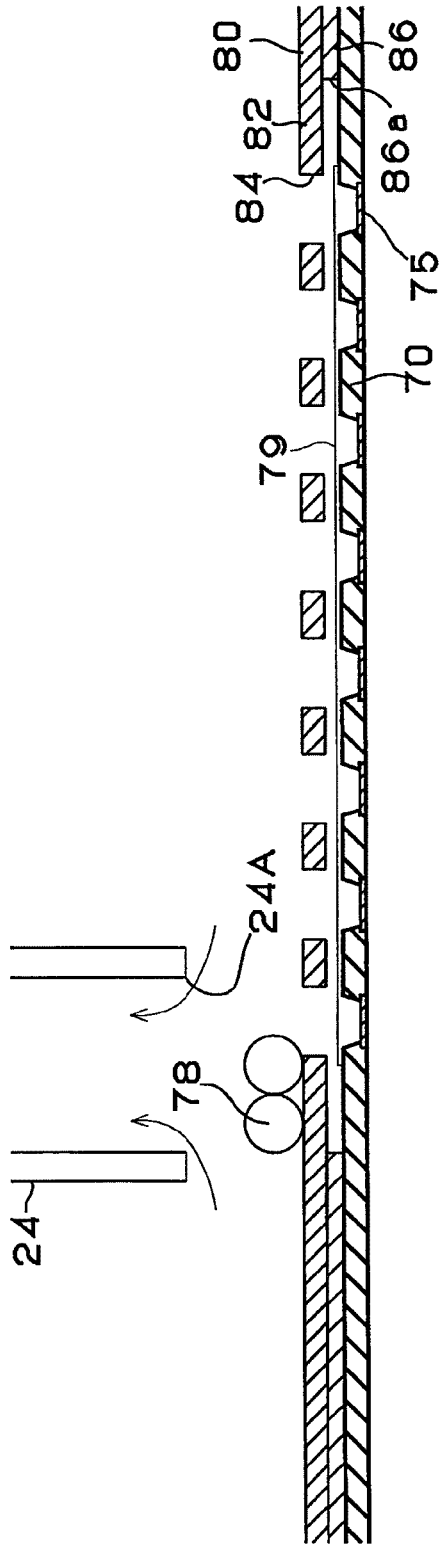
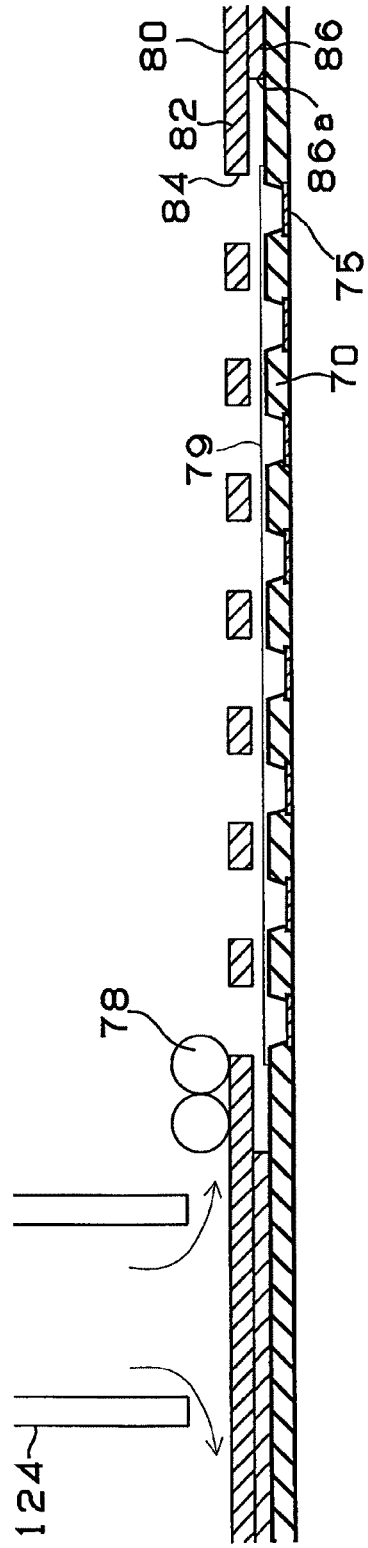

FIG. 9
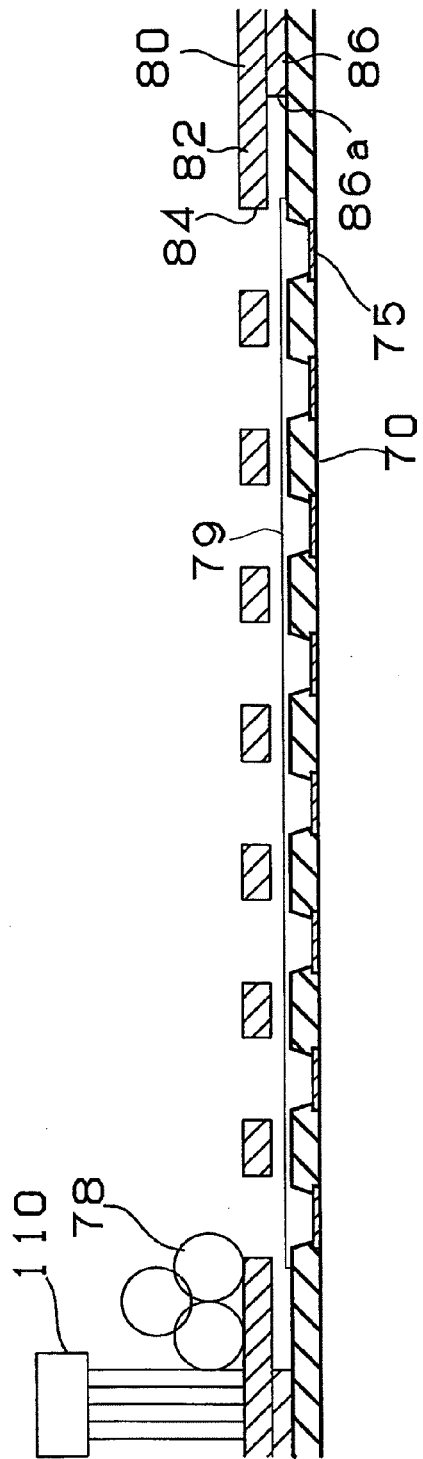
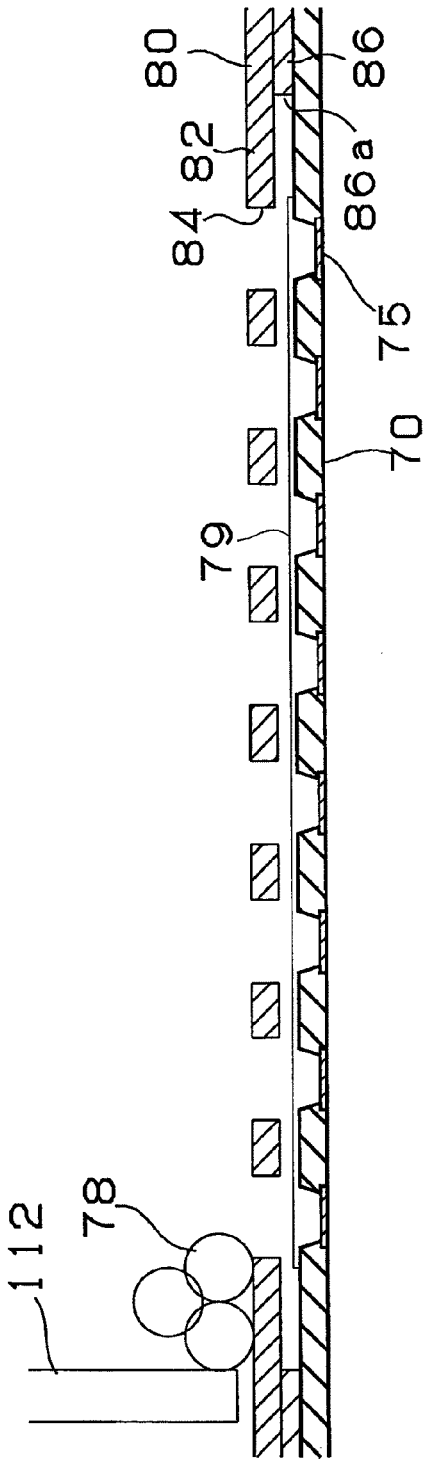

FIG. 10
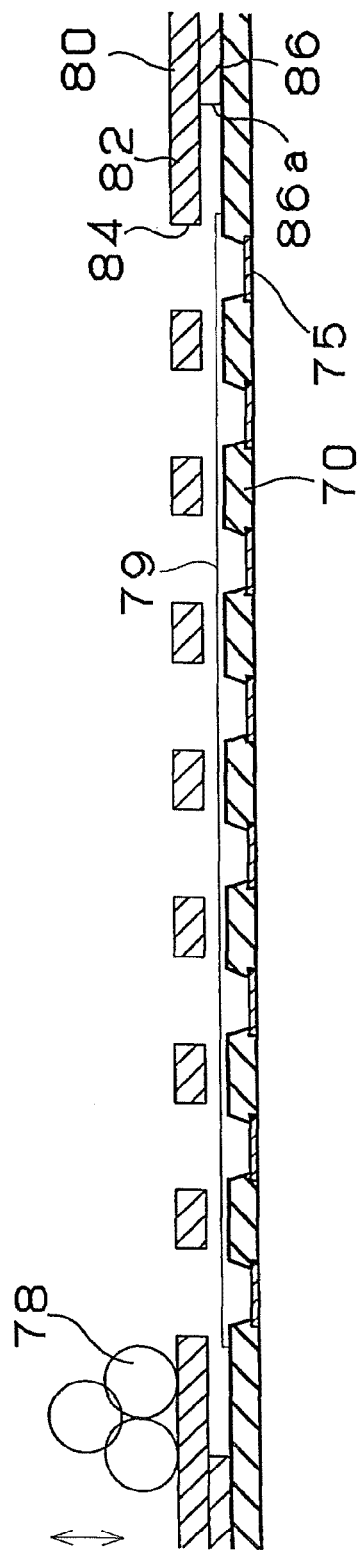
(A)
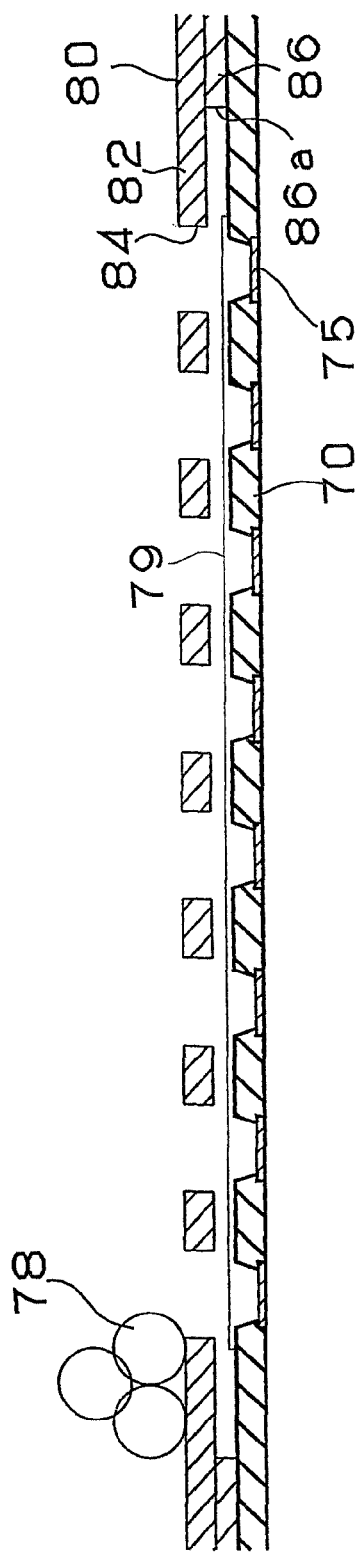
(B)

FIG. 11
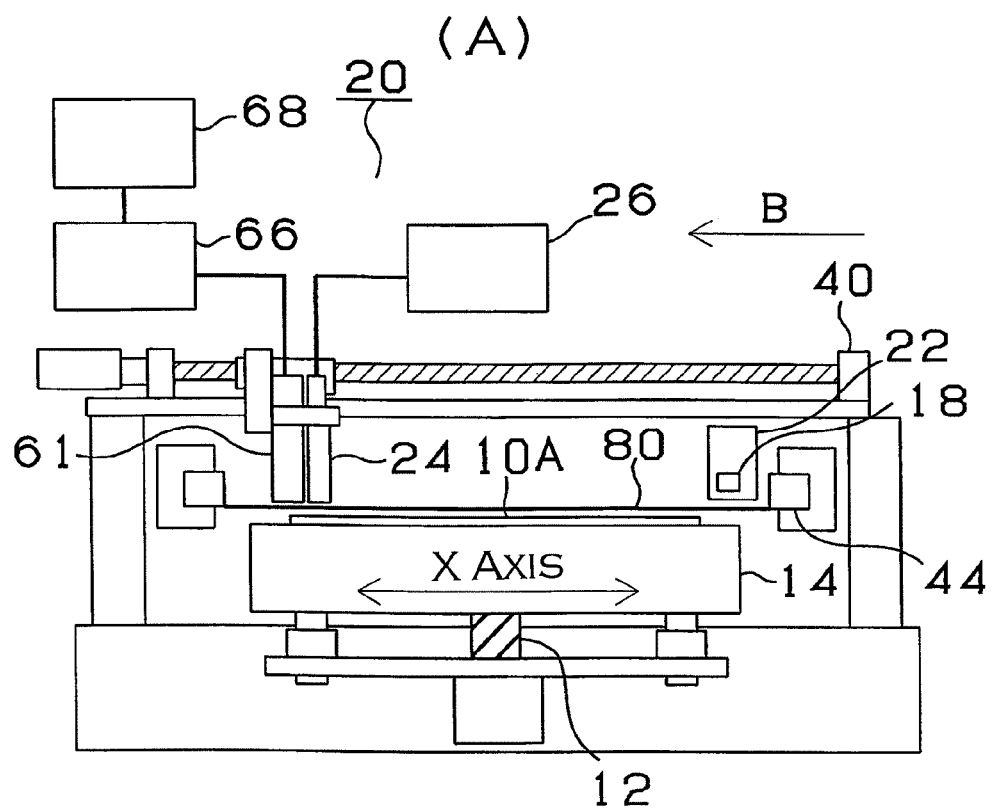
(A)
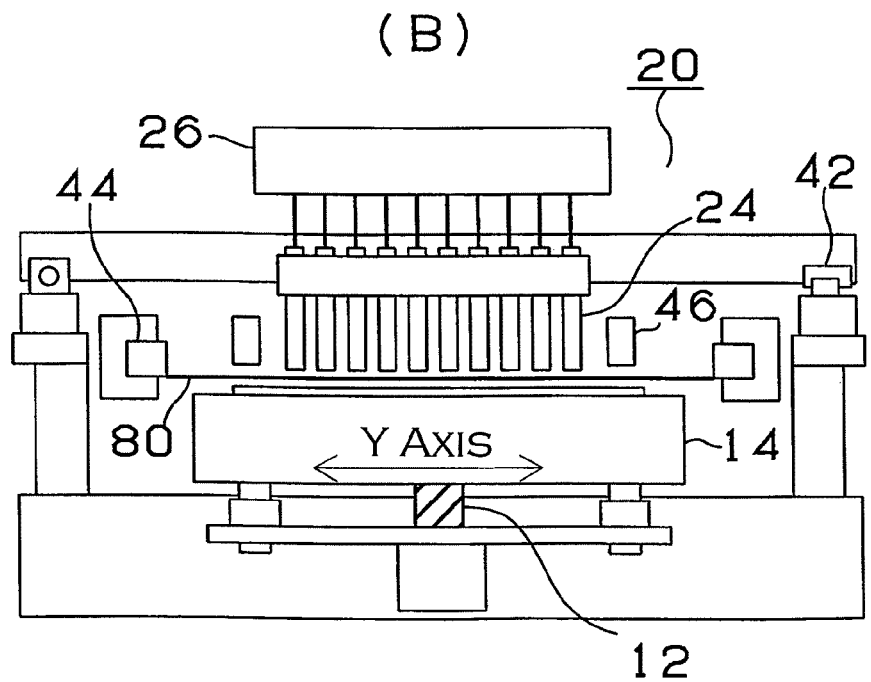
(B)

FIG. 12
(A)
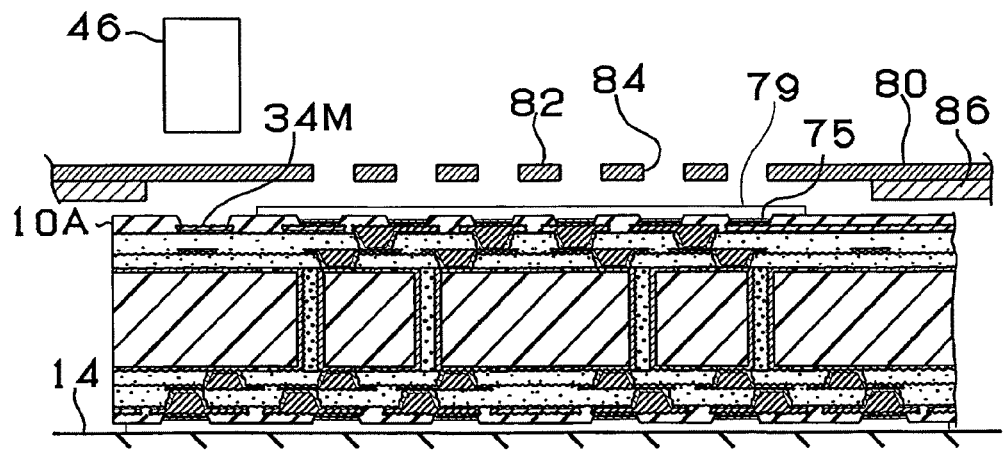
(B)
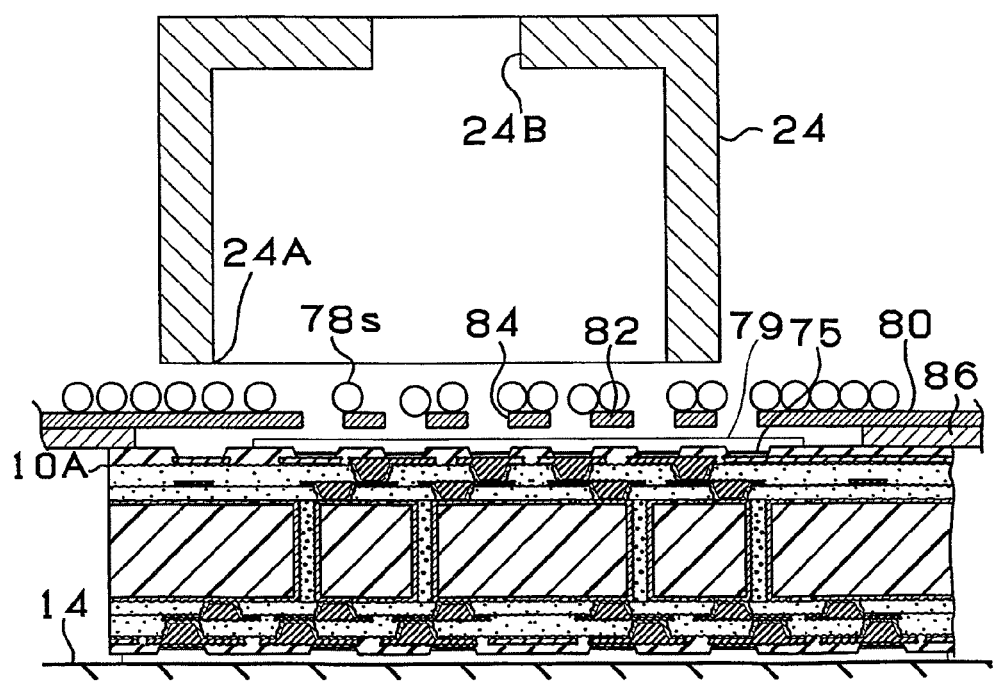

FIG. 13
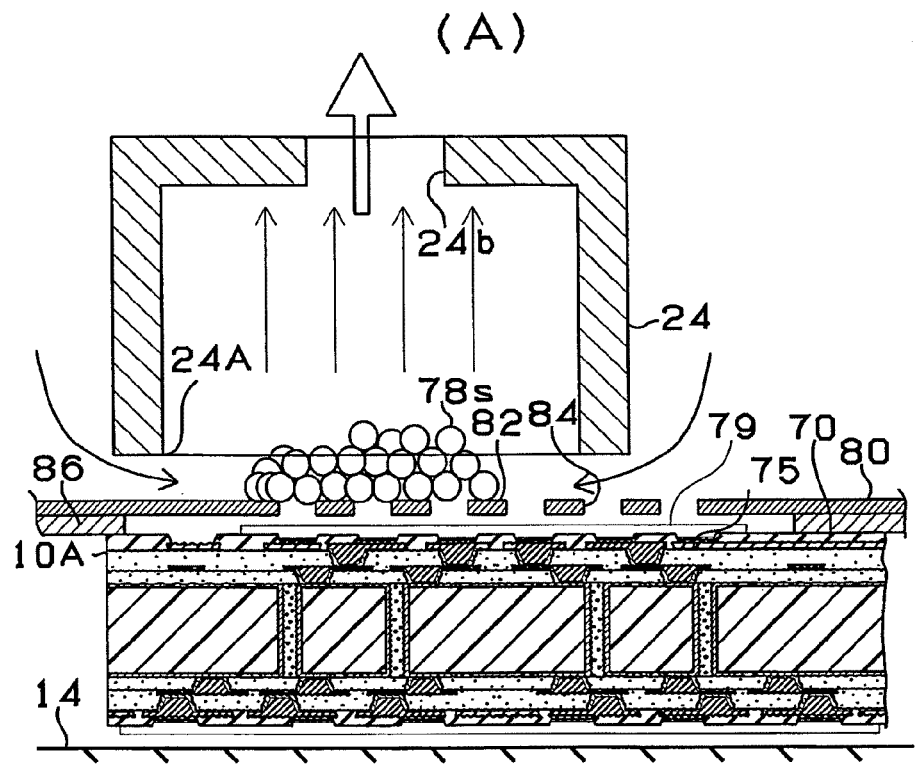
(A)
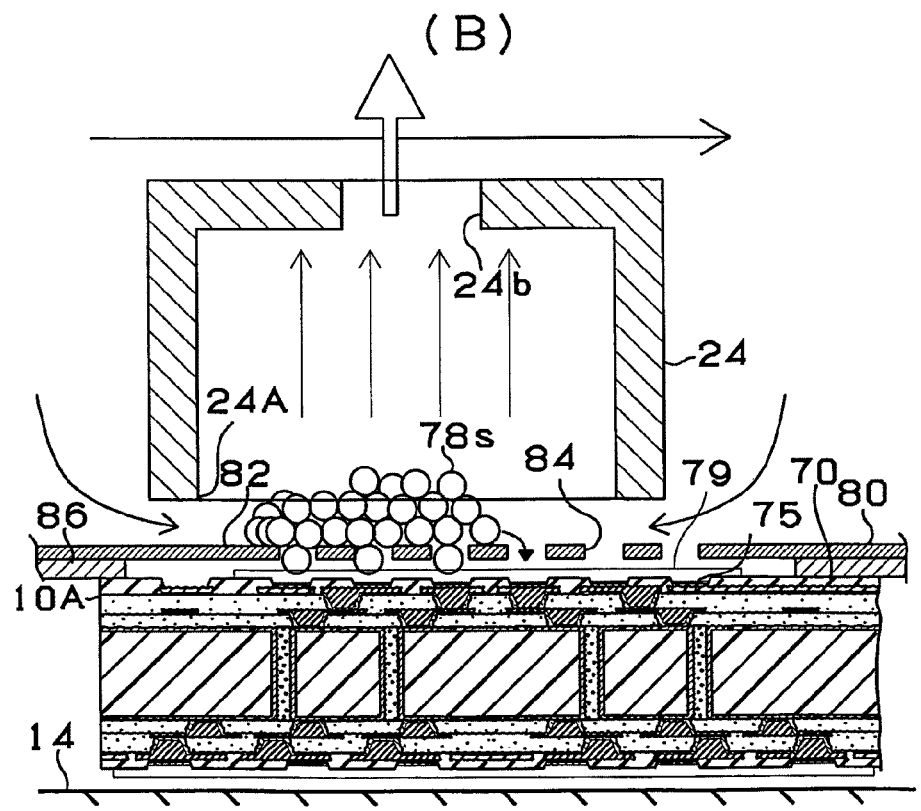
(B)

SOLDER BALL LOADING MASK, APPARATUS AND ASSOCIATED METHODOLOGY

CROSS-REFERENCE TO RELATED APPLICATIONS

The present application claims the benefits of priority to U.S. Application No. 61/057,479, filed May 30, 2008, the entire contents of which are incorporated herein by reference.

BACKGROUND

1. Field of the Invention

The present invention relates to a solder ball loading method for loading a solder ball onto a printed wiring board. The solder ball is to be made into a solder bump.

2. Background Art

Solder bumps are used for electrical connection between a printed wiring board and an IC chip. The solder bumps are formed through a process of printing a flux on a connection pad formed on a printed wiring board, a process of loading a solder ball on the connection pad with the flux printed thereon, or a process of forming a solder bump from the solder ball by performing reflow.

In the aforementioned process of loading the solder ball on the printed wiring board, a mask having openings for dropping the solder ball on the printed wiring board is used. The mask includes a spacer, formed from a plurality of protrusions, such that when the solder balls are loaded on the printed wiring board, the mask is aligned with the printed wiring board the protrusions are disposed between adjacent electrode portions. Japanese Patent Application Publication No. 2006-324618, the entire contents of which are incorporated herein by reference, is an example of this process.

SUMMARY

One aspect of the invention is a solder ball loading method for loading a solder ball on connection pads of a printed wiring board. The method includes applying a flux on a surface of the connection pads of the printed wiring board. Then the method includes preparing a mask that has a mask main body with a plurality of openings that correspond to the connection pads. The mask also includes a spacer whose opening portion corresponds to the plurality of openings on the mask main body. The plurality of openings on the mask main body are aligned to face the connection pads of the printed wiring board, and a solder ball is supplied to the mask. The solder ball is dropped on the connection pad through one of the plurality of openings of the mask main body.

Another aspect of the invention is a solder ball positioning mask. The solder ball positioning mask includes a mask main body that has a plurality of openings corresponding to a plurality of connection pads on a printed wiring board. The solder ball positioning mask also includes a spacer whose opening portion includes the plurality of opening on the mask main body.

A further aspect of the invention is a solder ball loading apparatus. The solder ball loading apparatus has a table that is movable in a vertical direction, and supports a printed wiring board. A solder ball positioning unit that positions a solder ball according to a solder ball positioning mask, and a solder ball removal tube removes excess solder balls from the solder ball positioning mask. A first airflow unit causes an airflow into the solder ball removal tube. The solder ball positioning mask included in the solder ball loading apparatus has a main body with a plurality of openings for transporting the solder ball to a connection pad of the printed wiring board. A spacer, whose opening portion encompasses the plurality of openings in the main body, also forms part of the solder ball positioning mask.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2(A) is a plan view of a mask main body, FIG. 2(B) is a plan view of a spacer, FIG. 7(A) is a schematic view of loading solder balls using the mask according to an exemplary embodiment of the present disclosure, FIG. 7(B) is a schematic view of loading solder balls according to a modified example of an exemplary embodiment of the present disclosure, FIG. 9(A) is a schematic view of loading solder balls using a mask according to an exemplary embodiment of the present disclosure, FIG. 9(B) is a schematic view of loading solder balls according to a modified example of the exemplary embodiment of the present disclosure, FIG. 10(A) is a schematic view of loading solder balls using a mask according to an exemplary embodiment of the present disclosure, FIG. 10(B) is a schematic view of loading solder balls according to a modified example of the exemplary embodiment of the present disclosure, FIG. 11(A) is a schematic representation of a solder ball loading apparatus according to an exemplary embodiment of the present disclosure, FIG. 11(B) is a schematic representation of the solder ball loading apparatus as seen from an arrow B of FIG. 11(A), FIG. 12(A) is a schematic view of alignment of a multilayer printed wiring board, FIG. 12(B) is a schematic view of supplying solder balls to a loading tube, FIG. 13(A) is a schematic view of collecting solder balls using a loading tube, FIG. 13(B) is a schematic view of collecting and inducing solder balls using a loading tube.

DETAILED DESCRIPTION

Figure 1:
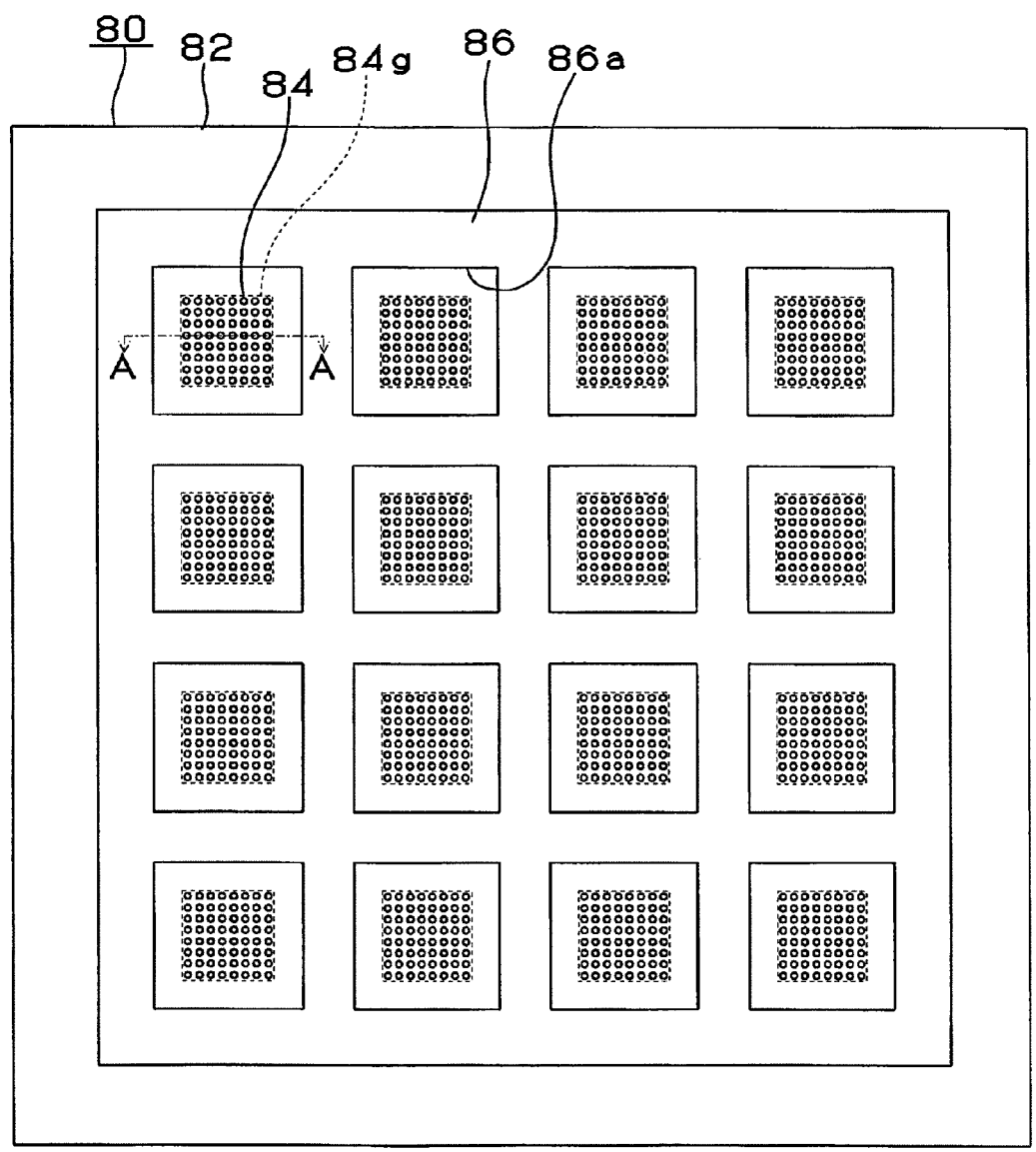
FIG. 1 is a rear view illustrating a mask according to an exemplary embodiment of the present disclosure.

The embodiments will now be described with reference to the accompanying drawings, wherein like reference numerals designate corresponding or identical elements throughout the various drawings.

An object of the present invention is to provide a solder ball loading method capable of securely loading solder balls on connection pads. In order to achieve this objective, the invention provides a solder ball loading method for loading a solder ball on connection pads of a printed wiring board. The method also includes applying a flux on a surface of the connection pad of the printed wiring board. A mask including a mask main body and a spacer is prepared. The mask main body has an opening group including a plurality of openings corresponding to the connection pads, and the spacer has an opening portion exposing the opening group. The mask is aligned with the printed wiring board so that the openings of the mask main body face the connection pads of the printed wiring board, and the solder balls are supplied to the mask and dropped on the connection pad through the openings of the mask main body.

In the solder ball loading method according to the present invention, the flux can be applied over all of the connection pad formation regions of the printed wiring board. This simplifies the manufacturing process when compared to a case where the flux is locally applied on each of the connection pads. In addition, since the flux is applied to the entire region, no connection pad is missed, and it is possible to securely load the solder ball on each of the connection pads.

In addition, the spacer and the mask main body are integrally formed, making accurate control of the height of the mask possible in order to equalize the heights of the solder balls and the upper surface of the mask. Accordingly, it is possible to securely load the solder balls on the connection pad, and to reduce a probability of that solder balls are not loaded on their respective pads or that a plurality of the solder balls are loaded on a single connection pad.

First Embodiment

A mask for loading solder balls on a printed wiring board according to a solder ball loading method of a first exemplary embodiment is described with reference to FIGS. 1 through 7.

Figure 3:
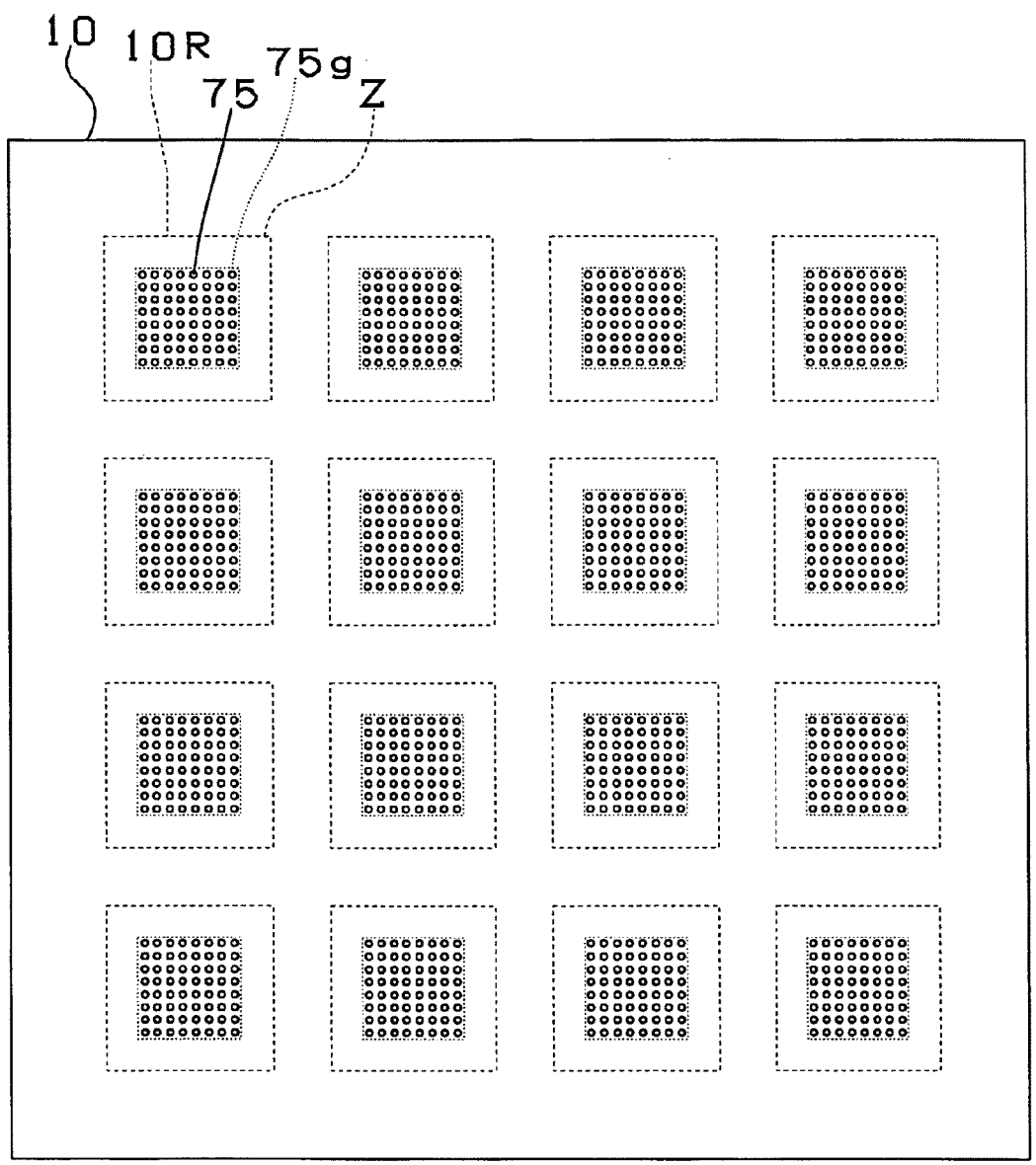
FIG. 3 is a plan view of a multilayer printed wiring board for gang printing where solder balls are loaded by using a mask according to an exemplary embodiment of the present disclosure.
Figure 4:
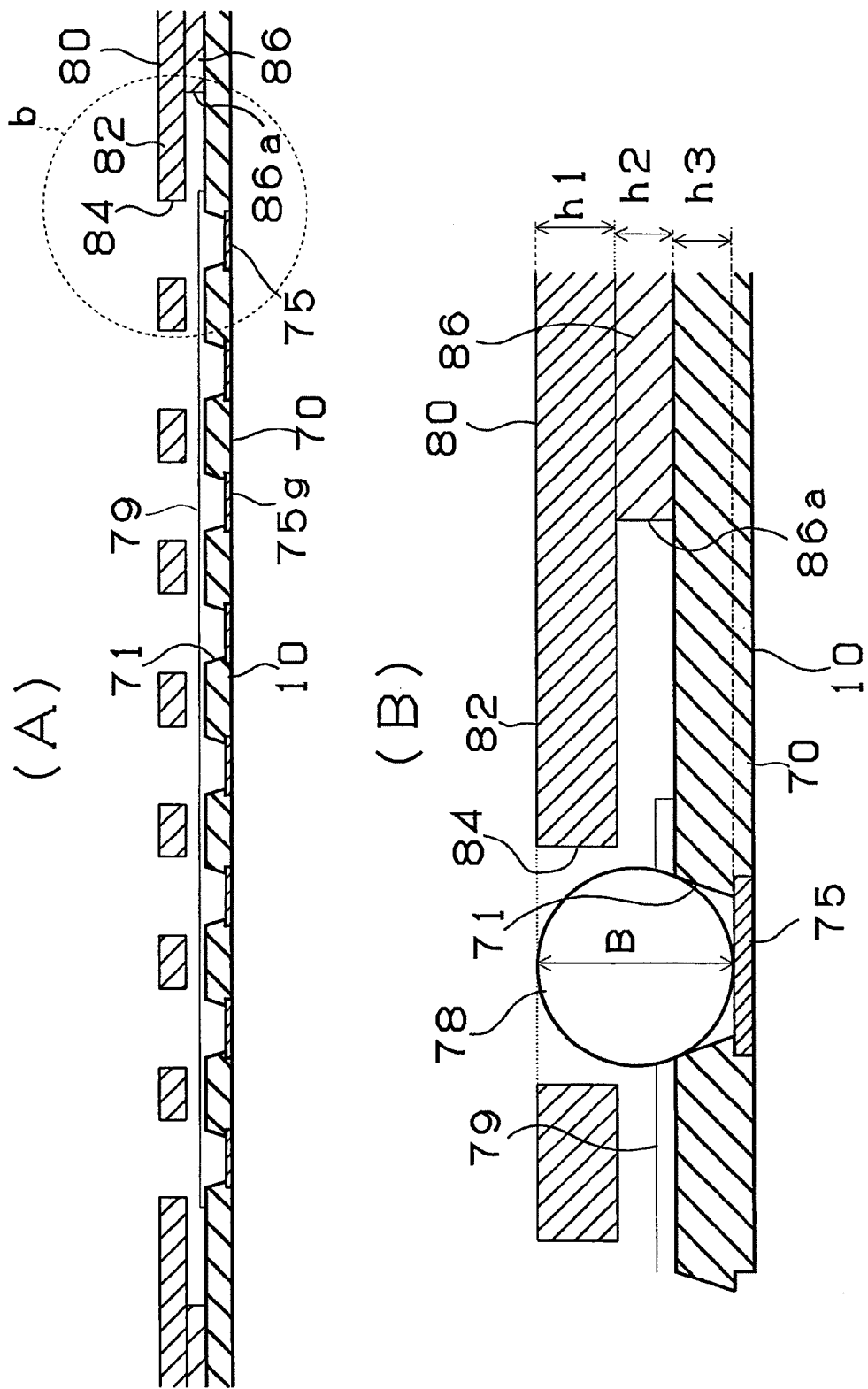
FIG. 4(A) is a view corresponding to a cross section A-A of FIG. 1.
FIG. 4(B) is an enlarged view illustrating a portion indicated by a circle b in FIG. 4(B)

FIG. 3 is a sheet-sized printed wiring board 10 having solder balls loaded thereon using a mask according to a first exemplary embodiment. For example, the sheet-sized printed wiring board 10 is a printed wiring board for gang printing in order to manufacture 4×4 inch-sized printed wiring boards 10R. In the figure, 16 printed wiring boards 10R cut along dotted lines Z are manufactured in the sheet-sized printed wiring board 10. A connection pad formation region 75g is disposed in a central portion of each printed wiring board 10R. A plurality of connection pads 75 for loading solder balls are formed in the connection pad formation regions 75g. Each connection pad formation region 75g denotes a specific region having a minimum area large enough to encompass the entire connection pads of the printed wiring board 10R.

FIG. 1 is a schematic view of a mask 80 used to load solder balls on the printed wiring board of FIG. 3. The mask 80 includes a mask main body 82 having opening groups 84g that include openings 84 corresponding to the connection pads 75 of the printed wiring board 10. A spacer 86 is formed with opening portions 86a for exposing the opening groups 84g of the mask 80, and the mask main body 82 and the spacer 86 are integrally formed. In this context, the term "integrally" includes formation of the two members by the same process, formation of the two members with the same material, and separate fixation of the two members. For example, FIG. 2(A) is a plan view of the mask main body 82, and FIG. 2(B) is a plan view of the spacer 86.

FIG. 4(A) corresponds to a cross section A-A of FIG. 1, when the mask 80 is loaded on the printed wiring board 10, and FIG. 4(B) is an enlarged view of a portion indicated by circle b in FIG. 4(A). A solder resist layer 70 is formed on a surface of the printed wiring board 10, and the connection pads 75 are exposed by openings formed on the solder resist layer 70. The flux 79 is applied on the entire connection pad formation region 75g of the printed wiring board 10. However, the region where the flux is applied is smaller than the opening portion 86a of the spacer 86. Thus, in the printed wiring board 10, the flux 79 is applied on the connection pad formation region 75g except for portions that are in contact with the spacer 86.

In the first exemplary embodiment, the flux 79 is applied on the connection pad formation region 75g except for the contact portions between the spacer 86 and the printed wiring board 10. Since the flux is not applied to the spacer 86, when the mask 80 is detached from the printed wiring board 10, a probability of defects, such as warping of the printed wiring board, misalignment of solder balls on the connection pad, and damage to the solder resist layer 70 is reduced.

As shown in FIG. 4(B), a thickness of the mask 80 is designed so that, when the solder balls 78 are loaded on the connection pads 75, a height of the upper surface of the mask 80 and a height of the vertexes of the solder balls 78 are substantially equal to each other. For example, when the solder ball 78 has a diameter B of 70 μm, a thickness h1 of the mask main body 82, a thickness h2 of the spacer 86, and a thickness h3 of the solder resist layer from the connection pad 75 are designed to be 25 μm, 30 μm, and 15 μm, respectively. In this context, the "vertex of the solder ball" denotes a portion of a surface of a solder ball corresponding to the maximum height of the solder ball.

Figure 19:
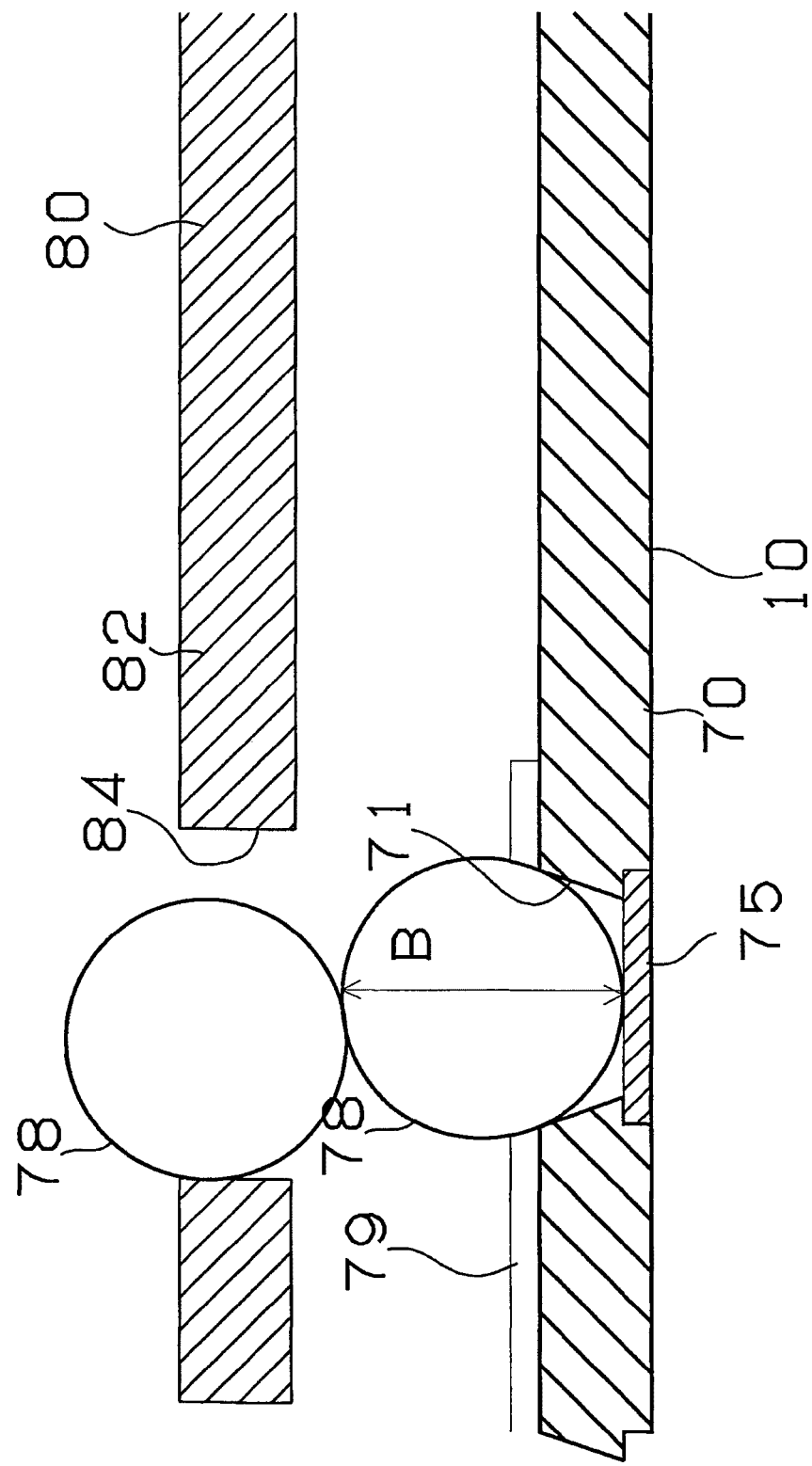
FIG. 19 is a schematic view of dropping solder balls when a height of solder balls is larger than that of a mask.

According to the solder ball loading method of the first exemplary embodiment, the vertexes of the solder ball 78 are substantially flush with the upper surface of the mask 80, so that a predetermined amount of solder balls can be securely loaded on the electrode pads 75 at a rate of one solder ball per electrode pad 75. In addition, it is possible to reduce a probability that solder balls are not loaded on every electrode pad or that a plurality of the solder balls are loaded on a single electrode pad. In FIG. 19, when the height of the upper surface of the mask 80 is higher than the height of the solder ball 78, other solder balls may be loaded through the openings of the mask main body on top of the solder balls already loaded on the connection pads. A case where the solder balls protrude from the upper surface of the mask 80 is not preferable because loading of solder balls on other connection pads may be difficult, and upon reflow, solder bumps having volumes exceeding a predetermined volume (for example, the volume of a single solder ball) may be formed, possibly reducing yield.

In addition, it is preferable that a diameter of the opening of the mask main body be 1.2 times to 1.5 times larger than a diameter of a solder ball. For example, in a case where solder balls having a diameter of 70 μm is used, the diameter of the opening of the mask main body is preferably in a range of 84 to 105 μm to ensure that the solder balls can be securely loaded on the connection pads. A diameter less than 1.2 times the solder ball diameter may prevent the solder balls from being loaded on the connection pads, and a diameter more than 1.5 times the diameter of the solder ball may increase a probability that a plurality of solder balls are loaded on a single connection pad.

FIG. 7(A) is a schematic view of loading solder balls using the mask 80 according to the first exemplary embodiment. A tube member 24 having an opening portion 24A facing the mask 80 is positioned over the mask 80. Air is absorbed through the tube member 24, to collect the solder balls 78 on the mask that are disposed just under the tube member 24. The tube member 24 is then moved in a horizontal direction relatively to the mask 80. Accordingly, the collected solder balls 78 are moved on the mask 80 and dropped on the connection pads 75.

FIG. 7(B) is a modified example of the first exemplary embodiment. In FIG. 7(A), the air is absorbed by the tube member 24. However, in the modified example of FIG. 7(B), the air is ejected from the tube member 24, and thus, the solder balls 78 are dropped on the connection pads 75.

According to the solder ball loading method of the first exemplary embodiment, a tube member 24 is disposed over the mask 80, and air is absorbed through an opening portion of the tube member 24 to collect solder balls 78. The tube member 24 is then moved in a horizontal direction, to move the collected solder balls 78 on the mask 80. Accordingly, the solder balls 78 are dropped on the connection pads 75 through the opening 84 of the mask. Therefore, fine solder balls can be securely loaded on all of the connection pads of the printed wiring board. Since the solder balls are moved without physical contact, unlike the case of using a squeegee, the solder balls can be loaded on the connection pads without damage, maintaining a uniform height for the solder bumps. The solder balls can even be securely loaded on a printed wiring board having large unevenness thereon, such as a build-up multilayer wiring board.

In the first exemplary embodiment, the portions forming the opening groups 84g of the mask main body 82 are supported by the spacer 86 in four directions and therefore are hardly deflected. Thus, a distance between the mask main body 82 and the printed wiring board 10 can be uniformly maintained. Further, the spacer 86 blocks air flow through the gap between the mask 80 and the printed wiring board 10, though air is absorbed by the tube member 24. In addition, the distance between the mask main body 82 and the printed wiring board 10 is uniformly maintained without floating the mask main body 82 with air flow from the lower portion of the mask 80.

Figure 5:
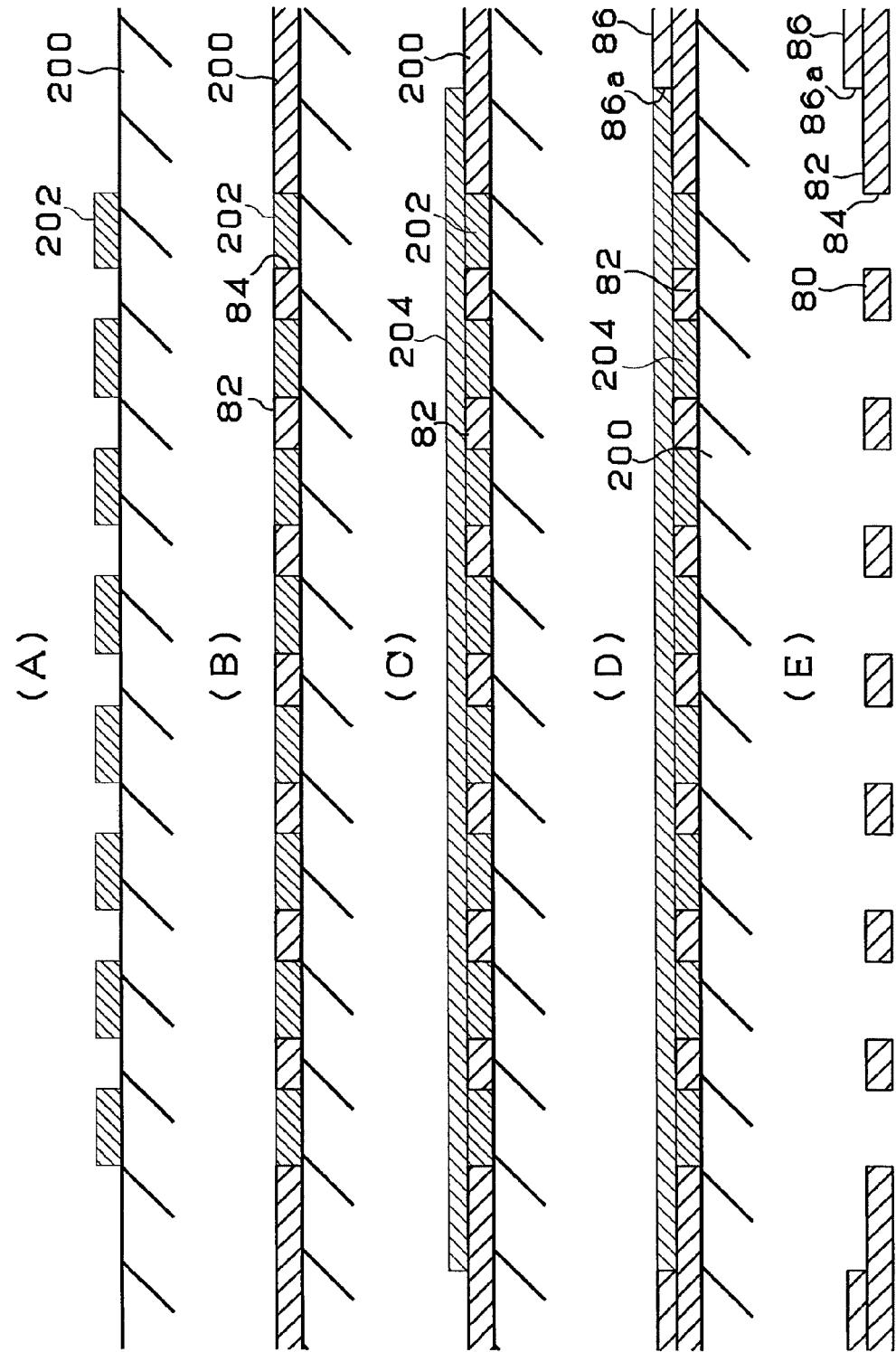
FIG. 5 is a schematic view of steps of a method for manufacturing a mask according to an exemplary embodiment of the present disclosure.

Next, a method for manufacturing the mask 80 of the first exemplary embodiment is described with reference to FIG. 5.

A plating resist 202 for forming the openings 84 of the mask 80 is formed on an SUS plate 200 that is subjected to surface treatment (FIG. 5(A)). In this state, the mask main body 82 having the openings 84 is formed using a nickel alloy electrolytic plating method (FIG. 5(B)). Next, the plating resist 204 that will form the opening portion of the spacer is formed on the mask main body 82 (FIG. 5(C)). Next, the spacer 86 having the opening portion 86a is formed using the nickel alloy electrolytic plating method (FIG. 5(D)). The plating resist 202 and the plating resist 204 are dissolved using a predetermined solution, and subsequently, the mask 80, including the spacer 86 and the mask main body 82, is detached from the SUS plate 200 (FIG. 5(E)). In this manner, the spacer 86 and the mask main body 82 are integrally formed through the plating to accurately adjust thickness thereof.

In the first exemplary embodiment, the spacer 86 and the mask main body 82 are integrally formed. However, the spacer 86 and the mask main body 82 may also be separately formed and adhered using, for example, ultrasonic adhesion or an adhesive. Alternatively, the spacer 86 and the mask main body 82 may be formed with different materials. For example, the mask main body 82 may be formed using a metal and the spacer 86 may be formed by using a resin.

Figure 6:
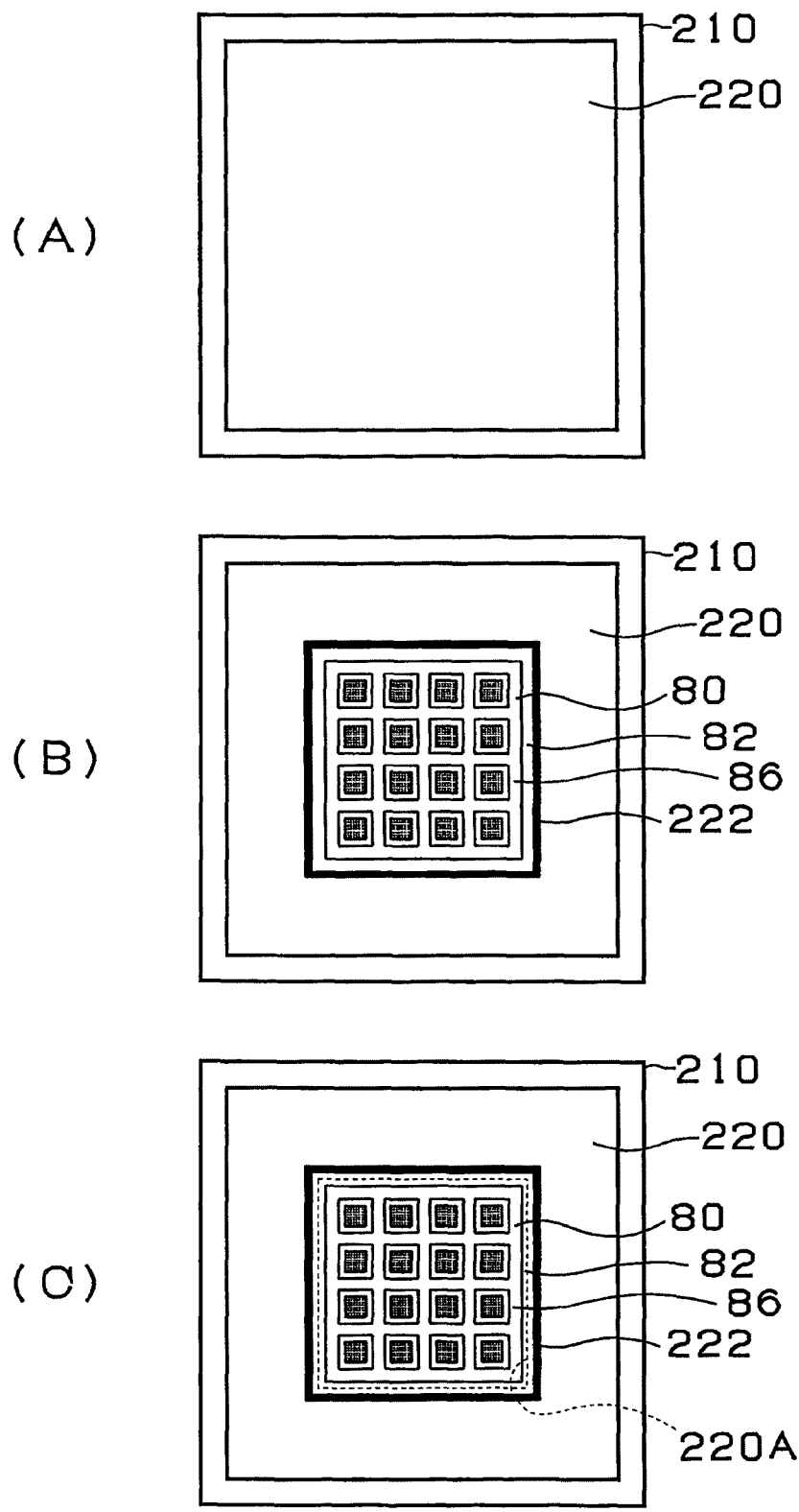
FIG. 6 is a schematic view of a step of fixing the mask on a frame according to an exemplary embodiment of the present invention.

Attachment of the mask 80 to a supporting mechanism is described with reference to FIG. 6. As shown in FIG. 6(A), the supporting mechanism is formed by adhering a nylon cloth 220 to a frame 210 with a uniform tension exerted thereon. The mask 80 is adhered at the center of the nylon cloth 220 using an adhesive 222 (FIG. 6(B)). The adhesive 222 is applied to an outer side of the spacer 86 in the outer circumference of the mask main body 82. Finally, in FIG. 6(C), the opening 220A is formed in the nylon cloth 220 in an inner side of the adhesive 222, to exert a uniform tension of the nylon cloth 220 on the mask 80.

In the first exemplary embodiment of FIG. 6(B) and FIG. 1, an outer circumference of the mask main body 82 extends over the outer circumference of the spacer 86. Tension is exerted to the outer circumference of the mask main body 82 to exert uniform tension to a portion of the mask main body 82 where the spacer 86 is located and to a portion where the opening portion of the spacer 86 is disposed. Accordingly, uniform tension can be exerted on the entire portions of the mask main body 82. As a result, deflection due to tension differences is suppressed, a height of the mask main body 82 can be accurately controlled to maintain the solder ball 78 and the mask 80 at the same height.

Second Embodiment

Figure 8:
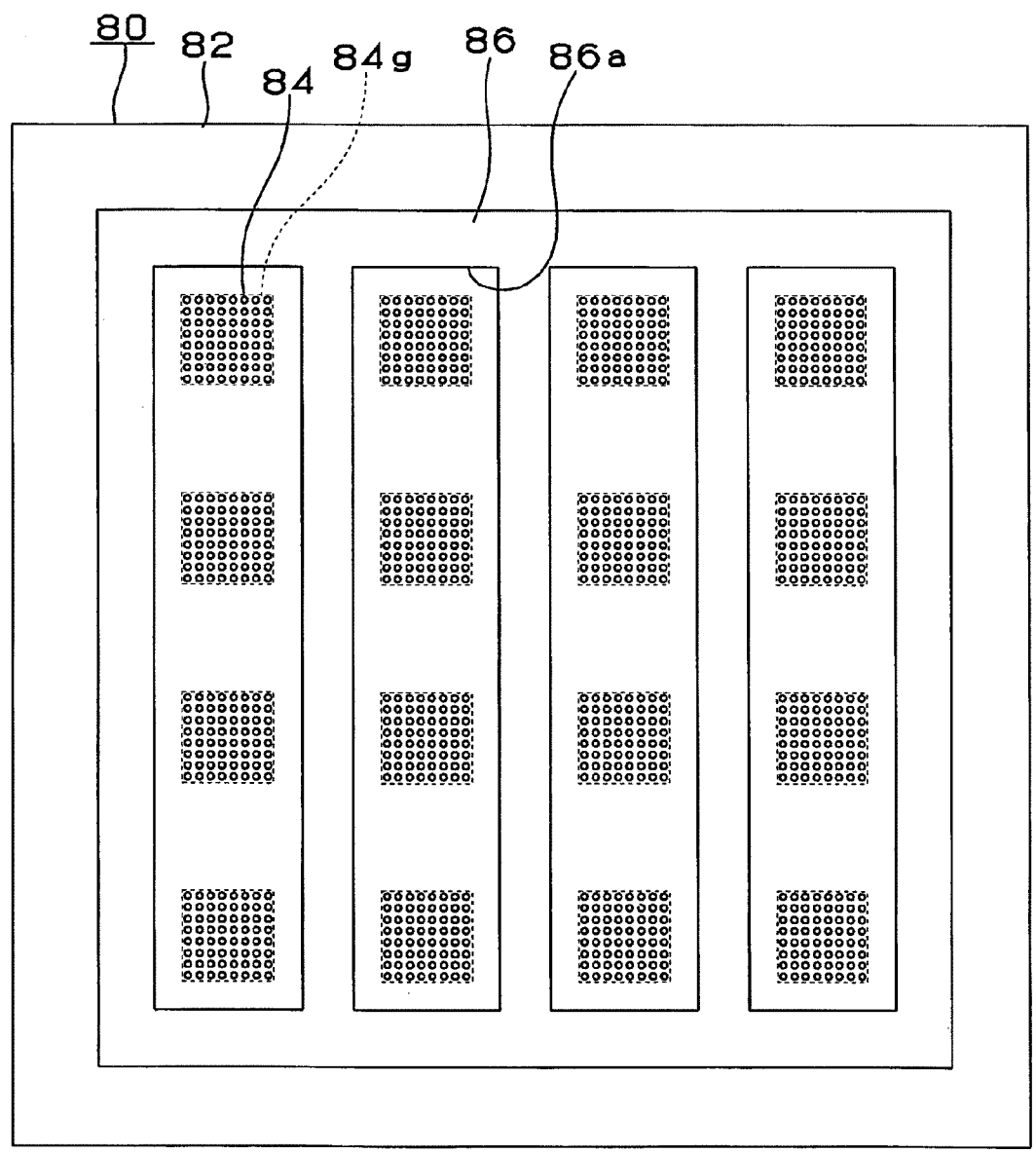
FIG. 8 is a schematic view of a mask according to an exemplary embodiment of the present disclosure.

A mask according to a second exemplary embodiment is described with reference to FIG. 8. In the second exemplary embodiment, opening portions 86a are formed in the spacer 86 so that a plurality of opening groups 84g of the mask main body 82 can be exposed through a single opening portion 86a.

Third Embodiment

A solder ball loading method according to a third exemplary embodiment is described with reference to FIG. 9(A). In the third exemplary embodiment, solder balls 78 are loaded on connection pads 75 by a brush 110.

Modified Example of Third Embodiment

A solder ball loading method according to a modified example of the third exemplary embodiment is described with reference to FIG. 9(B). In the modified example of the third exemplary embodiment, solder balls 78 are loaded on the connection pads 75 by using a flexible squeegee 112.

Fourth Embodiment

A solder ball loading method according to a fourth exemplary embodiment is described with reference to FIG. 10(A). In the fourth exemplary embodiment, solder balls 78 are loaded on connection pads 75 by vibrating the mask 80 and the printed wiring board 10.

Modified Example of Fourth Embodiment

A solder ball loading method according to a modified example of the fourth exemplary embodiment is described with reference to FIG. 10(B). In the modified example of the fourth exemplary embodiment, solder balls 78 are loaded by inclining the mask 80 and the printed wiring board 10.

Example 1

Next, a first example of the present invention is described with reference to FIGS. 11 to 17.

Figure 16:
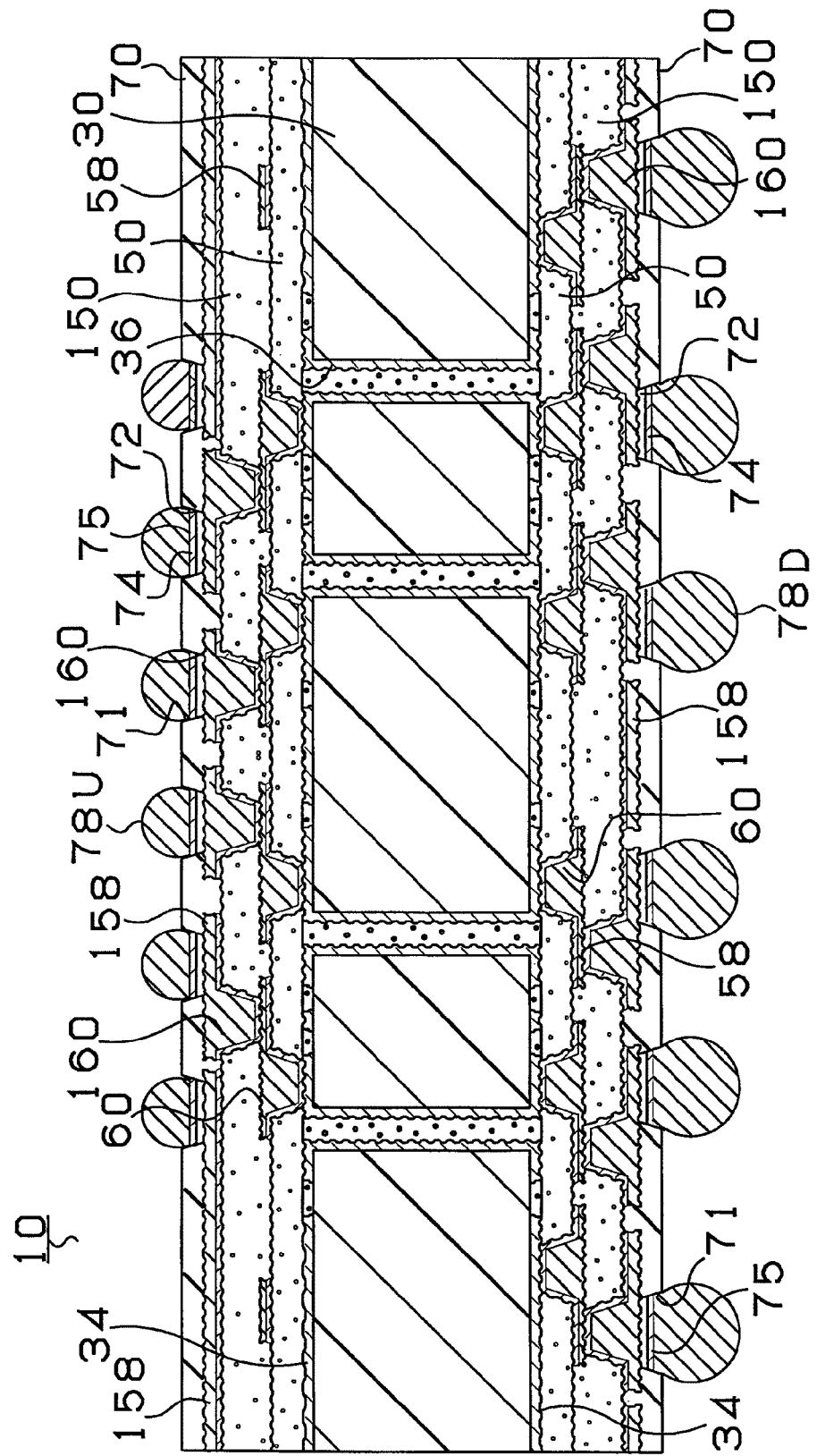
FIG. 16 is a cross-sectional view of a multilayer printed wiring board.
Figure 17:
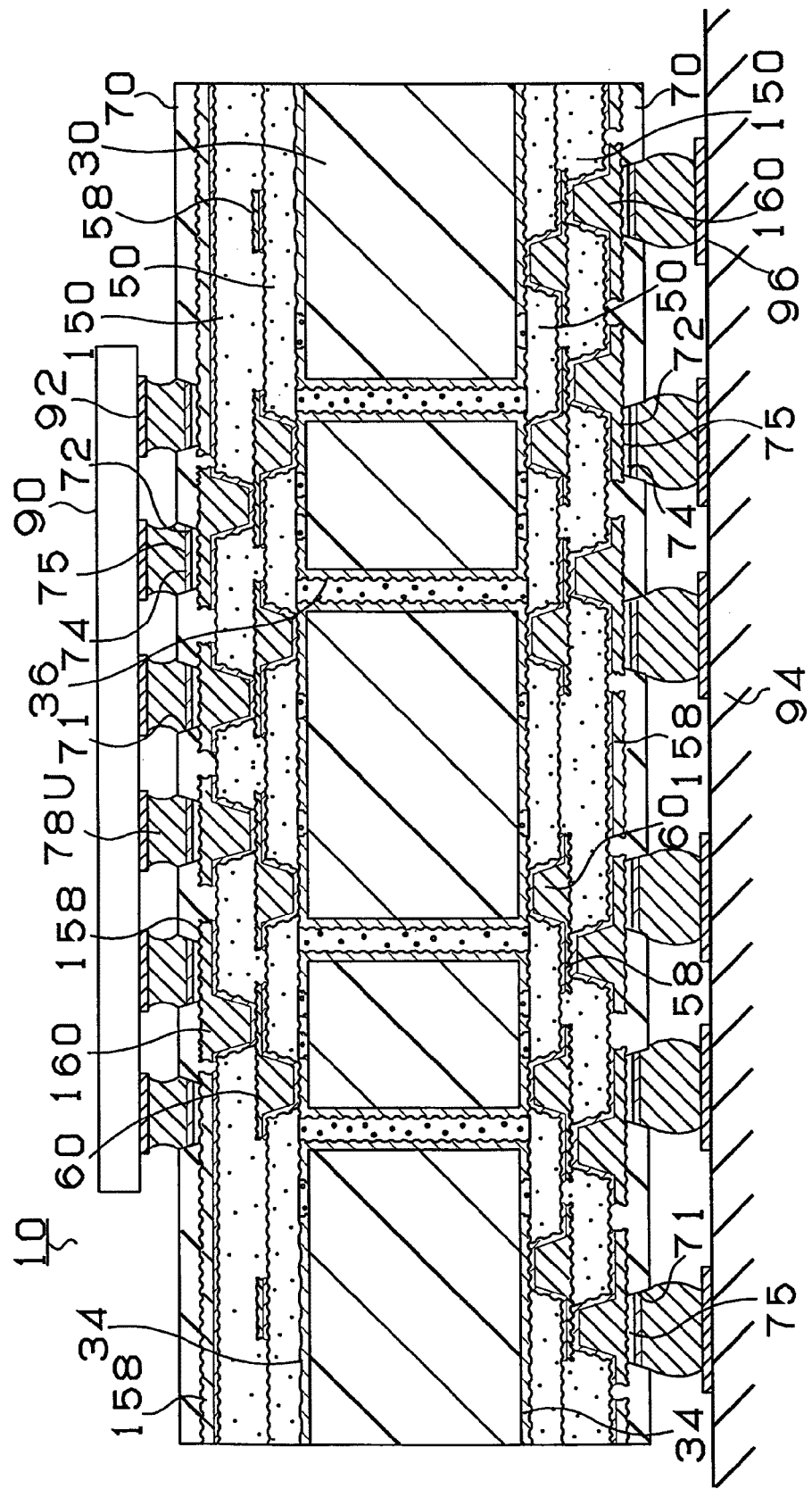
FIG. 17 is a cross-sectional view of an IC chip attached on the multilayer printed wiring board, illustrated in FIG. 16, that is mounted on a daughter board.

A construction of a multilayer printed wiring board 10 manufactured using a solder ball loading method according to the first example of the present invention is described with reference to FIGS. 16 and 17. FIG. 16 is a cross-sectional view of the multilayer printed wiring board 10, and FIG. 17 is a view of an IC chip 90 attached on the multilayer printed wiring board 10 of FIG. 16, and mounted on a daughter board 94. In the multilayer printed wiring board 10 of FIG. 16, conductor circuits 34 are formed on both surfaces of a core board 30. Front and rear surfaces of the core board 30 are interconnected via through holes 36.

In addition, a conductor circuit 58 as a conductor circuit layer is formed through an interlayer resin insulating layer 50 on the conductor circuit 34 of the core board 30 through via holes 60. A conductor circuit 158 is formed on the conductor circuit 58 through an interlayer resin insulating layer 150, and is connected to the conductor circuit 58 through via holes 160 formed on the interlayer resin insulating layer 150.

A solder resist layer 70 is formed on an outermost layer of the via-holes 160 and the conductor circuit 158. A nickel plating layer 72 and a gold plating layer 74 are disposed on the openings 71 of the solder resist layer 70 to form the connection pads 75. The solder bumps 78U are formed on the connection pads 75 of the upper surface of the printed wiring board 10, and the solder bumps 78D are formed on the connection pads 75 of the lower surface of the printed wiring board 10.

In FIG. 17, the solder bumps 78U on the upper surface of the multilayer printed wiring board 10 are connected to electrodes 92 of the IC chip 90, and the solder bumps 78D on the lower surface of the printed wiring board 10 are connected to lands 90 of the daughter board 94.

Figure 15:
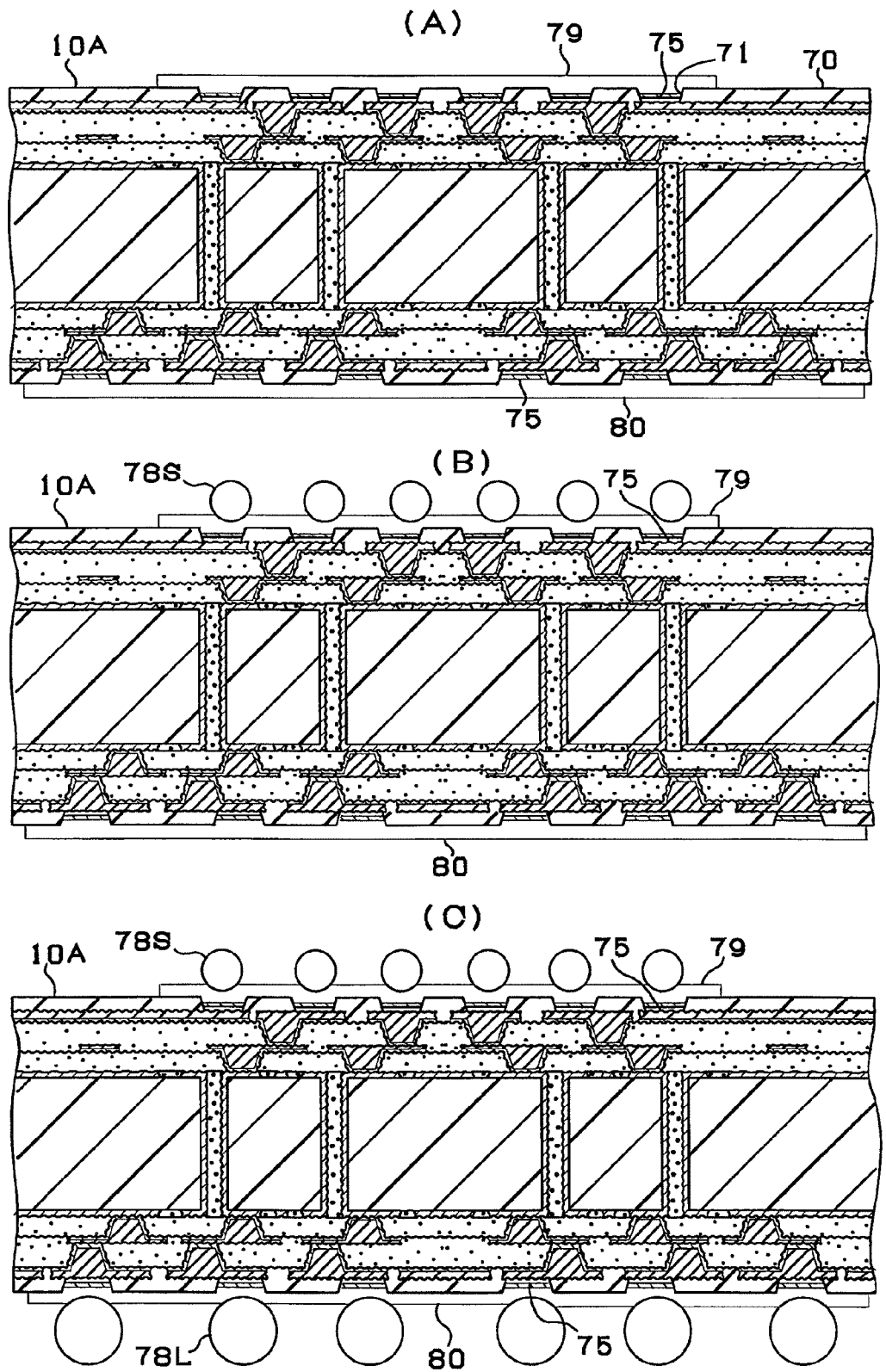
FIG. 15(A) is a schematic view of a process for manufacturing a multilayer printed wiring board.
FIG. 15(B) is a schematic view of processes for manufacturing a multilayer printed wiring board.
FIG. 15(C) is a schematic view of processes for manufacturing a multilayer printed wiring board.
Figure 18:
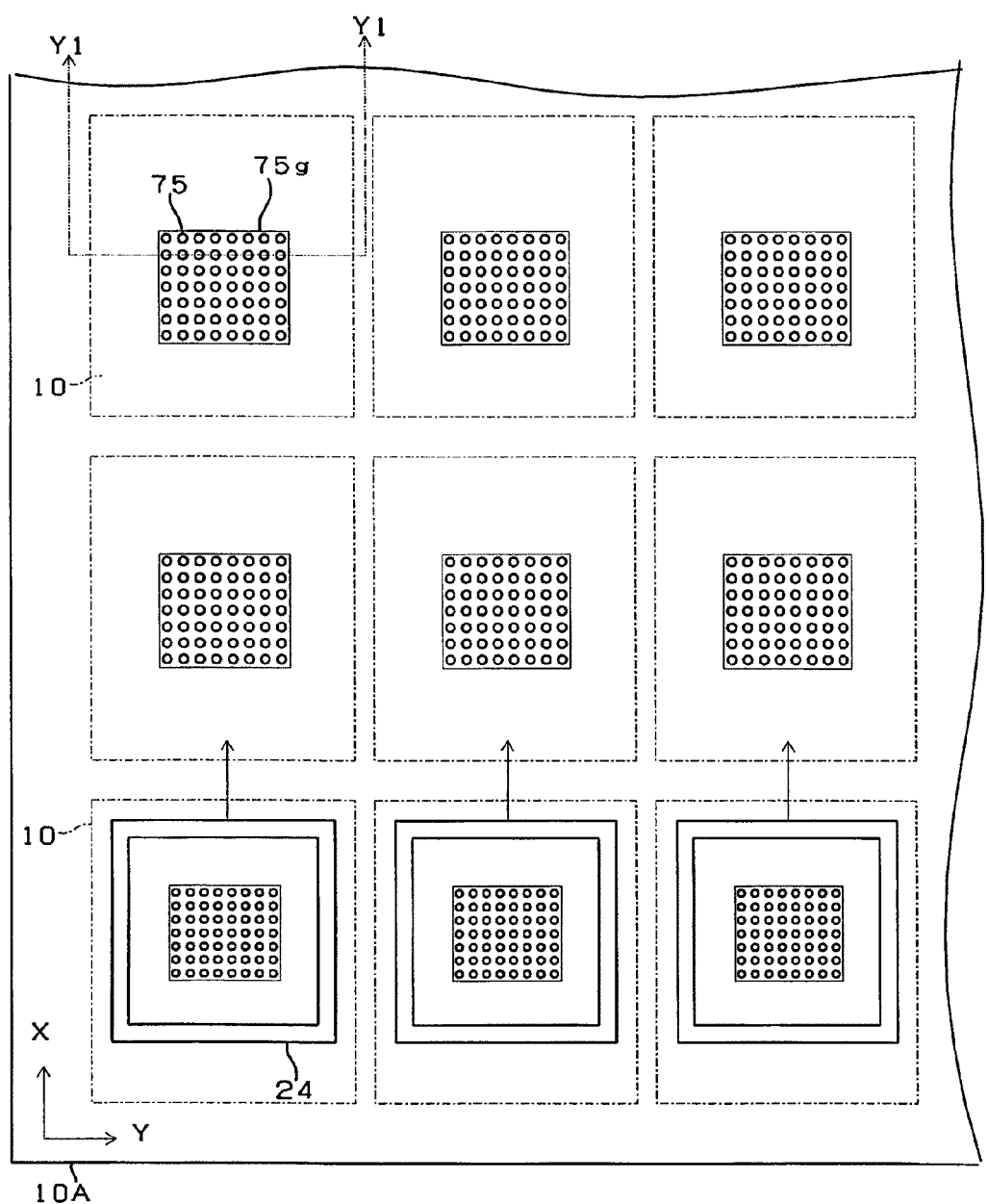
FIG. 18 is a plan view of a multilayer printed wiring board for gang printing.

FIG. 18 is a plan view of a sheet-sized multilayer printed wiring board 10A for gang printing. In this context, "gang printing" refers to simultaneously printing all printed wiring boards 10 on the sheet-sized multilayer printed wiring board 10A. The multilayer printed wiring board 10A is divided into individual multilayer printed wiring boards 10 having connection pad formation regions 75g that include connection pads 75 arrayed in matrix. The multilayer printed wiring boards 10 are separated by cutting along a dotted line in the figure. FIG. 15 is a view of a process of forming the solder bumps on the multilayer printed wiring board 10A for gang printing and corresponds to a cross-sectional view taken along line Y1-Y1 of FIG. 18. In FIG. 15(A), the flux 79 is printed over the entire surface including openings 71 of the solder resist layer 70 and a surface of the connection pads 75. As shown in FIG. 15(B), fine solder balls 78S (for example, a solder ball manufactured by Hitachi Metals, LTD., having a diameter of equal to or larger than 40 ρmΦ and less than 200 μmΦ) are loaded on the connection pads 75 on the upper side of the multilayer printed wiring board 10A using a solder ball loading apparatus described below. In this case, if the solder ball has a diameter of less than 40 μmΦ, the solder ball is too light to be dropped on the connection pad 75. If the solder ball has a diameter of larger than 200 μmΦ, the solder ball is too heavy to be collected in a tube member, such as the tube member 24 of FIG. 7(A). In either case, at least some connection pads may be left without solder balls. As recognized by the present inventor, it is important to use solder balls having a diameter of equal to or larger than 40 μmΦ but less than 200 μmΦ to avoid the above-described issues. This range is useful for fitting solder balls in openings 71 of the solder resist layer 70 when the diameter of openings 71 have been reduced during manufacturing of the printed wiring board 10. In addition, since the solder balls are small, they are difficult to absorb using an absorption pad. Therefore, the method according to this exemplary embodiment is more effective than conventional methods for at least these reasons.

Next, in FIG. 15(C), solder balls 78L having a typical diameter (25 μm) are absorbed and loaded on the connection pads 75 of the lower side of the multilayer printed wiring board 10A using a conventional absorption pad (for example, U.S. Pat. No. 1,975,429). The solder balls are then heated by a reflow furnace, and in FIG. 16, for example, 500~30000 solder bumps 78U are formed on the upper side of the printed wiring board 10A with a pitch equal to or larger than 60 μm but less than 200 μm. Continuing the example, 250 solder bumps 78D are formed with a pitch of 2 mm on the lower side of the printed wiring board 10A. Manufacturing solder balls of a pitch less than 60 μm is difficult. A pitch equal to or larger than 200 μm allows the solder balls to be manufactured without problems using conventional methods, and such solder balls still suit the present invention.

A method as described above may be used, for example, in the printed wiring board 10A of FIG. 17, where the multilayer printed wiring board 10A for gang printing is divided into individual multilayer printed wiring boards 10, and the IC chip 90 is mounted through the solder bumps 78U by reflow. Then, the multilayer printed wiring board 10, on which the IC chip 90 is mounted, may be attached on the daughter board 94 through the solder bumps 78D.

A solder ball loading apparatus for loading fine solder balls 78s (having a diameter less than 200 μm) on the connection pads 75 of the multilayer printed wiring board 10A of FIG. 15(B) is described with reference to FIG. 11. FIG. 11(A) is a schematic view of a solder ball loading apparatus according to the solder ball loading method of the first example, and FIG. 11(B) is a schematic view of the solder ball loading apparatus of FIG. 11(A) as seen from arrow B.

The solder ball loading apparatus 20 includes an XYθ absorption table 14 for positioning and supporting the multilayer printed wiring board 10A, an up/down moving axis 12 for lifting the XYθ absorption table 14, a ball alignment mask 80 having openings corresponding to connection pads 75 of the multilayer printed wiring board, a loading tube (tube member) 24 for inducing the solder balls moving on the ball alignment mask 80, an absorbing unit 26 for pressing the loading tube 24, an absorbed ball removing tube 61 for recovering redundant solder balls, an absorbing unit 66 for pressing the absorbed ball removing tube 61, an absorbed ball removing absorption apparatus 68 of holding the recovered solder balls, a mask clamp 44 for clamping the ball alignment mask 80, an X direction moving axis 40 for moving the loading tube 24 and the absorbed ball removing tube 61 in the X direction, a moving axis support guide 42 for supporting the X direction moving axis 40, a alignment camera 46 for photographing the multilayer printed wiring board 10, a solder ball detection sensor 18 for detecting a remaining amount of the solder balls below the loading tube 24, and a solder ball supplying apparatus 22 for supplying the solder balls to the loading tube 24. The solder ball supplying apparatus 22 supplies solder balls to the loading tube 24 based on the remaining amount detected by the remaining amount detection sensor 18. In the solder ball loading apparatus 20 of FIG. 11, only the X direction moving axis 40 for moving the loading tube 24 and the absorbed ball removing tube 61 in the X direction are provided, but moving mechanisms for moving the loading tube 24 and the absorbed ball removing tube 61 in the Y direction may also be provided. Alternatively, the loading tube 24 may be fixed, and the side of the ball alignment mask 80 and the printed wiring board 10A may be moved in the X and Y directions.

FIG. 1 is a rear view illustrating the mask 80 used for the solder ball loading apparatus 20 of FIG. 11. As described above, the mask 80 includes a mask main body 82 where opening groups 84g made of openings 84 corresponding to the connection pads 75 of the printed wiring board 10 are formed and a spacer 86 where opening portions 86a for exposing the opening groups 84a are formed. The mask main body 82 and the spacer 86 are integrally formed.

FIG. 4(A) corresponds to a cross section taken along line A-A of FIG. 1 when the mask 80 is mounted on the printed wiring board 10. FIG. 4(B) is an enlargement of a portion indicated by a circle b in FIG. 4(A).

The solder resist layer 70 is formed on a surface of the printed wiring board 10, and the connection pads 75 are formed to be exposed from the openings 71 of the solder resist layer 70. Flux 79 is applied on the connection pad formation region 75g including the connection pads 75 of one printed writing board 10. In the present invention, flux is applied on each of the connection pads 75 except for contact portions between the spacer 86 and the printed wiring board 10. Thus, an area where flux is applied is smaller than an area of the opening portion of the spacer 86.

For this reason, the flux is not attached on the spacer 86. Therefore, when the mask is detached from the printed wiring board, the printed wiring board need not to be inverted, and damage to the solder resist layer 70 is reduced.

A case where the solder balls 78 are dropped on the connection pads 75, as in FIG. 4(B), a height of the vertexes of the solder balls is substantially flush with a height of a surface of the mask main body 82. According to the solder ball loading method of the first example, the heights of the solder ball 78 and the upper surface of the mask 80 are made equal, to securely load a predetermined amount of the solder balls on the electrode pads 75, where each electrode pad 75 receives one solder ball 78. This also reduces a probability that solder balls are not loaded onto every electrode pad 75, or that a plurality of the solder balls are loaded on a single electrode pad 75.

In the first example, the loading tube 24 is made of a conductive metal such as SUS stainless, Ni, and Cu, and the loading tube is grounded at a side of the solder ball loading apparatus 20. When the solder balls are moved and carried on the ball alignment mask 80, the solder balls may be electrically charged due to collision therebetween. However, solder balls having small diameter and light weight are not attached on the loading tube 24 electrostatically, and can be securely loaded on the printed wiring board 10.

In the plan view of FIG. 18, a plurality of loading tubes 24 (although not shown, the absorbed ball removing tubes 61 are also disposed similarly to the loading tubes) of the solder ball loading apparatus 20 corresponding to each of the connection pad formation regions 75g are disposed on the sheet-sized multilayer printed wiring board 10A in the Y direction. In this example one loading tube 24 corresponds to one connection pad formation region 75g. However, the loading tube 24 may be designed to have a size corresponding to a plurality of the connection pad formation regions 75g. Further, in this example the Y direction is selected for the convenience of description. However, the loading tubes may also be disposed in the X direction.

The XYθ absorption table 14 of FIG. 11 positions, holds, and corrects the multilayer printed wiring board's 10 position relative to where the solder balls 78 are loaded. The alignment camera 46 detects the alignment marks of the multilayer printed wiring board 10 on the XYθ absorption table 14 and adjusts a positions between the multilayer printed wiring board 10 and the ball alignment mask 80 based on this detected position. The solder ball detection sensor 18 detects the remaining amount of the solder balls 78 using an optical method.

Figure 14:
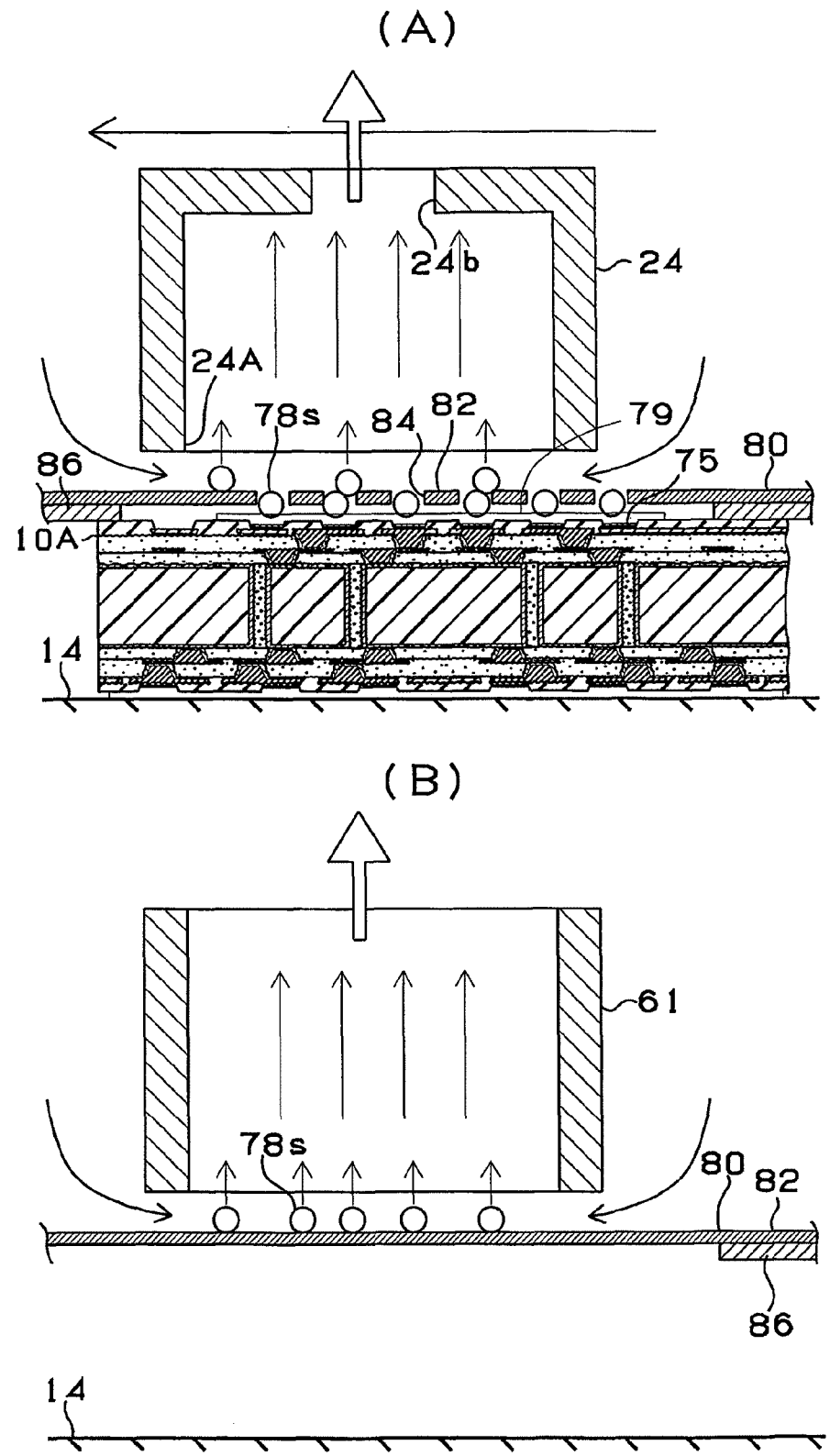
FIG. 14(A) is a schematic view of dropping solder balls on connection pads.
FIG. 14(B) is a schematic view of removing solder balls using a absorbed ball removing tube.

Next, solder ball loading process using the solder ball loading apparatus 20 is described with reference to FIGS. 12 to 14.

(1) Identifying and Correcting of Position of Multilayer Wiring Board

In FIG. 12(A), alignment marks 34M of multilayer printed wiring board 10A for gang printing are identified by the alignment camera 46, and position of the multilayer printed wiring board 10A with respect to the ball alignment mask 80 is corrected by the XYθ absorption table 14. The position of the printed wiring board 10A is adjusted so that the openings 84 of the ball alignment mask 80 correspond to the connection pads 75 of the multilayer printed wiring board 10A.

(2) Supplying of Solder Balls

Further, in FIG. 12(B), the solder ball supplying apparatus 22 supplies a predetermined amount of the solder balls 78s to the side of the loading tube 24. Alternatively, the solder balls 78s may be supplied to the loading tube 24 in advance.

(3) Loading of Solder Balls

In FIG. 13(A), the loading tube 24 is positioned over the ball alignment mask 80 while maintaining a predetermined clearance (for example, 0.5 times to 4 times a diameter of the solder ball) to the ball alignment mask 80. Air is absorbed by the absorption portion 24b, so that an air flow rate at the gap between the loading tube and the ball alignment mask 80 is in a range of 5 m/sec to 35 m/sec. Accordingly, the solder balls 78s are collected on the ball alignment mask 80 disposed just below the opening portion 24A of the loading tube 24.

Next, in FIGS. 13(B), 14(A), and 18, the loading tubes 24 that are disposed along the Y axis of the multilayer printed wiring board 10A of FIGS. 11(A) and (B) are moved in a horizontal direction along the X axis by the X direction moving axis 40. Therefore, the solder balls 78s collected on the ball alignment mask 80 are moved according to the moving of the loading tubes 24. The solder balls 78s are thus loaded on the connection pads 75 of the multilayer printed wiring board 10A through the openings 84 of the ball alignment mask 80. Accordingly, the solder balls 78s can be sequentially aligned on all of the connection pads 75 of the side of the multilayer printed wiring board 10A.

(4) Removing of Attached Solder Balls

In FIG. 14(B), redundant solder balls 78s are induced by the loading tubes 24 to positions of the ball alignment mask 80 where no openings exist, and subsequently are absorbed and removed by the absorbed ball removing tubes 61.

(5) Detachment of Board

The multilayer printed wiring board 10A is then detached from an XYθ absorption table 14.

According to the solder ball loading method of the first example, the loading tube 24 is positioned over the ball alignment mask 80, and air is absorbed by the absorption portion 24B (see FIG. 12(B)) of the loading tube 24 to collect the solder balls 78s. This is accomplished by moving the loading tube 24 in the horizontal direction to move the collected solder balls 78s on the ball alignment mask 80. Then solder balls 78s are dropped through the openings 84 of the ball alignment mask 80 on the connection pads 75 of the multilayer printed wiring board 10A. For this reason, fine solder balls 78s can be securely loaded on all of the connection pads 75 of the multilayer printed wiring board 10A. Further, because the solder balls 78s are moved in a non-contact manner, the solder balls are loaded on the connection pads without damage, and the height of the solder bumps 78U is uniformly maintained. As recognized by the present inventors, a product manufactured according to the present invention exhibits good performance in mount-ability and an environment-resistance test when tested with ICs mounted. Examples of such tests include heat cycle tests and high temperature/high humidity tests. Even in a case of a multilayer printed wiring board that has unevenness on its surface, the solder balls 78 can still be securely loaded on the connection pads 75 because the method described herein is independent of product flatness. In addition, since the fine solder balls 75s are securely loaded on the connection pads, and solder bumps having uniform heights can still be formed, even when a printed wiring board has a connection pad pitch of 60 μm to 150 μm and a diameter of opening of the solder resist of less than 150 μm.

Further, because the solder balls 78 are induced by the absorbing force, it is possible to prevent the solder balls from being agglutinated or adhered. Also, the number of loading tubes 24 can be adjusted, making the present invention adaptable to various sheet-sized multilayer printed wiring boards 10A. Thus, the present invention can be used for multi-product, small-lot-sized production.

Example 2

(1) Manufacturing of Printed Wiring Board

A double-sided copper layered board (for example, MCL-E-67 manufactured by Hitachi Chemical Co., LTD.) is used as a base material. Through-hole conductors and conductor circuits may be formed on the board by using any well-known method. Next, interlayer insulating layers and conductor circuit layers may be alternately laminated thereon using any well-known method (for example, "Build-Up Multilayer Printed Wiring Board" written by Takagi Kiyoshi, published on Jul. 20, 2000 by NIKKAN KOGYO SHIMBUN, LTD), and connection pads for electrical connection to ICs is formed on the outmost conductor circuit layer. Next, a solder resist layer including openings (for example, 150 μmΦ) is formed so as to expose the connection pads.

(2) Loading of Solder Balls (1) A commercially-available rosin-based flux is then applied on connection pad formation regions of the manufactured printed wiring board. Next, the printed wiring board is mounted on the aforementioned absorption table 14 of the solder ball loading apparatus 20 according to the present invention. The alignment marks of the printed wiring board 10 and the ball alignment mask 80 are identified using a CCD camera, and the printed wiring board and the ball alignment mask are aligned. The ball alignment mask 80 has a spacer on a rear surface thereof. As the ball alignment mask 80, a Ni mask having openings with a diameter of 110 μm at positions corresponding to the connection pads of the printed wiring board is used. Although the Ni metal mask is used, other materials may also be used, such as a SUS or polyimide ball alignment mask. It is preferable that a diameter of the openings formed on the ball alignment mask 80 is 1.2 times to 1.5 times a diameter of the solder ball used. Next, a SUS loading tube having a size (1.1 times to 4 times a size of the connection pad formation region) substantially corresponding to the connection pad formation region and a height of 200 mm is positioned over the metal mask (ball alignment mask) with a clearance of 0.5 times to 4 times a diameter of a solder ball. For example, Sn63Pb37 solder balls (manufactured by Hitachi Metals, LTD.) having a diameter of 80 μmΦ may be loaded on the peripheral ball alignment masks. Although Sn/Pb solders are used for the solder balls in the Example 2, the composition of the solder balls is not limited thereto, and any Pb-free solder selected from a group consisting of Sn with at least one of Ag, Cu, In, Bi, Zn, and the like may also be used.

Air is absorbed by the absorption portion (5 to 20 mmΦ) 24B (see FIG. 12(B)) on the upper portion of the loading tube 24, to collect the solder balls on the ball alignment mask 80 into the loading tube.

The loading tube 24 is then moved at a speed of 20 mm/sec, to move the solder balls. The solder balls are dropped through the opening portion of the ball alignment mask, and loaded onto the connection pads. In Example 2, the loading tube 24 is made of a conductive metal such as a SUS stainless, Ni, and Cu, and is grounded at the side of the solder ball loading apparatus 20.

After redundant solder balls on the ball alignment mask 80 are removed, the solder ball alignment mask 80 and the printed wiring board 10 are separately detached from the solder ball loading apparatus 20.

The solder balls loaded on the connection pads are also subjected to reflow at a temperature of, for example, 230° C., to form predetermined solder bumps.

Obviously, numerous modifications and variations of the present invention are possible in light of the above teachings. It is therefore to be understood that within the scope of the appended claims, the invention may be practiced otherwise than as specifically described herein.

The invention claimed is:

1. A solder ball loading method for loading solder balls on connection pads of a sheet printed wiring board, comprising multiple printed wiring boards each of which has a respective connection pad formation region that includes a plurality of said connection pads, the method comprising:

forming a solder resist layer on the sheet printed wiring board, the solder resist layer having openings each of which expose at least part of a respective connection pad within the connection pad formation regions of each of the printed wiring boards;

applying a flux on an entire surface of each of the connection pad formation regions such that the connection pads of each of the printed wiring boards are covered with the flux;

preparing a mask including:
  a mask main body having multiple opening groups, each opening group corresponding to each respective connection pad formation region of the sheet printed wiring board, and each opening group including a plurality of openings corresponding to the plurality of connection pads of the connection pad formation region, and
  a spacer interposed between the printed wiring board and the mask main body having multiple spacer opening portions, each spacer opening portion corresponding to each respective opening group having the plurality of openings of the mask main body, wherein a diameter of said openings of the mask main body is larger than a diameter of a respective opening of the solder resist layer, the spacer contacting only an area of the printed wiring board where no flux is provided, and a connection pad formation region being smaller than the opening portion of the spacer;
aligning the openings of the mask main body to face the respective connection pads of the printed wiring board; and
supplying the solder ball to the mask; and
dropping the solder ball on the connection pad having flux thereon, through one of the plurality of openings of the mask main body.

2. The solder ball loading method according to claim 1, wherein the spacer is integrally formed on the mask main body.

3. The solder ball loading method according to claim 1, wherein when the solder ball is dropped on the connection pad, a vertex of the solder ball is substantially flush with a top surface of the mask main body when the space is interposed between the printed wring board and the mask main body.

4. The solder ball loading method according to claim 1, wherein a diameter of the plurality of openings of the mask main body ranges from 1.2 times to 1.5 times a diameter of the solder ball.

5. The solder ball loading method according to claim 1, wherein an outer boundary of the mask main body is larger than an outer boundary of the spacer.

6. The solder ball loading method according to claim 1, wherein the dropping the solder ball step further includes:
  positioning a tube member over the mask with an opening portion of the tube member facing the mask,
  absorbing air through the tube member to collect the solder ball on the mask, the solder ball being disposed below the tube member,
  moving the tube member in a horizontal direction relative to the mask to move the solder ball on the mask, and
  dropping the solder ball on one of the connection pads.

* * * * *